(12) United States Patent
Park et al.

(10) Patent No.: US 9,991,127 B2
(45) Date of Patent: Jun. 5, 2018

(54) METHOD OF FABRICATING INTEGRATED CIRCUIT DEVICE BY USING SLURRY COMPOSITION

(71) Applicant: Samsung Electronics Co., Ltd., Suwon-si, Gyeonggi-do (KR)

(72) Inventors: Sang-hyun Park, Hwaseong-si (KR); Jae-hak Lee, Yongin-si (KR); Bo-hyeok Choi, Yongin-si (KR); Sang-kyun Kim, Hwaseong-si (KR); Won-ki Hur, Suwon-si (KR)

(73) Assignees: SAMSUNG ELECTRONICS CO., LTD., Gyeonggi-Do (KR); K.C. TECH CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/286,976

(22) Filed: Oct. 6, 2016

(65) Prior Publication Data

US 2017/0207100 A1 Jul. 20, 2017

(30) Foreign Application Priority Data

Jan. 15, 2016 (KR) ........................ 10-2016-0005332

(51) Int. Cl.
*H01L 21/306* (2006.01)
*C09G 1/02* (2006.01)
*H01L 21/02* (2006.01)
*H01L 21/308* (2006.01)

(52) U.S. Cl.
CPC .......... *H01L 21/30625* (2013.01); *C09G 1/02* (2013.01); *H01L 21/02532* (2013.01); *H01L 21/3081* (2013.01); *H01L 21/3085* (2013.01)

(58) Field of Classification Search
CPC ......... H01L 21/30625; H01L 21/02532; H01L 21/3081; H01L 21/3085; C09G 1/02
USPC .................................................. 438/690–693
See application file for complete search history.

(56) References Cited

U.S. PATENT DOCUMENTS

| 3,429,080 | A | 2/1969 | Lachapelle et al. |
| 2005/0005525 | A1 | 1/2005 | Li et al. |
| 2005/0031789 | A1* | 2/2005 | Liu .......................... C09G 1/02 427/340 |
| 2007/0293049 | A1 | 12/2007 | Minamihaba et al. |
| 2010/0144149 | A1 | 6/2010 | Ward et al. |
| 2014/0170852 | A1 | 6/2014 | Noller et al. |
| 2014/0342562 | A1 | 11/2014 | Yokota et al. |
| 2015/0060400 | A1 | 3/2015 | Tamada |

(Continued)

FOREIGN PATENT DOCUMENTS

| JP | 2008004621 A | 1/2008 |
| JP | 2015074737 A | 4/2015 |
| KR | 20050049138 A | 5/2005 |

(Continued)

*Primary Examiner* — Duy Vu N Deo
(74) *Attorney, Agent, or Firm* — Harness, Dickey & Pierce, PLC

(57) ABSTRACT

A method of fabricating an integrated circuit device may include forming a polishing stop layer and a semiconductor layer on a substrate, and selectively polishing the semiconductor layer from a surface which simultaneously exposes the polishing stop layer and the semiconductor layer, by using a slurry composition including a compound composition and polishing particles. The compound composition may include a sulfonate compound and a terminal amine group-including compound.

20 Claims, 24 Drawing Sheets

(56) References Cited

U.S. PATENT DOCUMENTS

2016/0068711 A1    3/2016  Choi et al.
2016/0068713 A1*   3/2016  Kitamura ................ C09G 1/04
                                                 252/79.1

FOREIGN PATENT DOCUMENTS

| KR | 20140059216 A | 5/2014 |
| KR | 20140094624 A | 7/2014 |
| KR | 20140125316 A | 10/2014 |
| KR | 20150010570 A | 1/2015 |
| KR | 20150014924 A | 2/2015 |
| KR | 20150067784 A | 6/2015 |
| KR | 20150096156 A | 8/2015 |

* cited by examiner

METHOD OF FABRICATING INTEGRATED CIRCUIT DEVICE BY USING SLURRY COMPOSITION

CROSS-REFERENCE TO RELATED APPLICATION

This application claims the benefit of Korean Patent Application No. 10-2016-0005332, filed on Jan. 15, 2016, in the Korean Intellectual Property Office, the disclosure of which is incorporated herein in its entirety by reference.

BACKGROUND

The inventive concepts relate to a method of fabricating an integrated circuit device, and more particularly, to a method of fabricating an integrated circuit device by using a slurry composition for chemical mechanical polishing (CMP).

Along with the increasing degree of integration of semiconductor devices, an effort to improve the performance of a transistor by using various materials has been made. In particular, as a gate length is increasingly shorter, a need for a high-mobility channel layer capable of providing a further improved carrier mobility in place of silicon comes to the fore. Therefore, there is a need to develop a slurry composition capable of being used for polishing a high-mobility channel layer, and there is a need to develop a method facilitating fabrication of an integrated circuit device exhibiting desired performance.

SUMMARY

The inventive concepts provide a method of fabricating an integrated circuit device, the method being capable of suppressing dishing on a polishing target surface of a semiconductor layer, erosion due to a polishing loss of unwanted portions, and the occurrence of an unwanted step difference while securing a sufficient polishing selectivity between the semiconductor layer and a polishing-preventive mask, when the semiconductor layer required for forming a high-mobility channel layer is polished.

According to some example embodiments, a method of fabricating an integrated circuit device may include forming a polishing stop layer and a semiconductor layer on a substrate; and selectively polishing the semiconductor layer from an upper surface. The upper surface may simultaneously expose an upper surface of the polishing stop layer and an upper surface of the semiconductor layer, based on applying a slurry composition to the upper surface, the slurry composition including a compound composition and polishing particles. The compound composition may include a sulfonate compound and a terminal amine group-containing compound.

According to some example embodiments, a method of fabricating an integrated circuit device may include forming a first semiconductor layer on a first region and a second region of a substrate, such that a first portion of the first semiconductor layer is on the first region and a second portion of the first semiconductor layer is on the second region. The method may include forming a mask pattern on the first portion of the first semiconductor layer. The mask pattern may cover the first portion of the first semiconductor layer such that the second portion of the first semiconductor layer is exposed by the mask pattern. The method may further include forming a recess space on the second region based on at least partially removing the second portion of the first semiconductor layer exposed by the mask pattern. The method may further include filling the recess space with a second semiconductor layer to form a combined layer. The combined layer may include at least the mask pattern and the second semiconductor layer. The combined layer may include an upper surface. The upper surface of the combined layer may include an upper surface of the mask pattern and an exposed upper surface of the second semiconductor layer. The method may further include polishing the second semiconductor layer based on applying a slurry composition to the upper surface of the combined layer such that the mask pattern is a polishing stop layer. The slurry composition may include a compound composition and polishing particles. The compound composition may include a sulfonate compound and a terminal amine group-including compound. The method may further include removing the mask pattern and forming a plurality of fin-type active regions on each of the first region and the second region by patterning each of the first semiconductor layer and the second semiconductor layer.

According to some example embodiments, a method may include forming a polishing stop layer and a semiconductor layer on a substrate to form a combined layer. The combined layer may include an upper surface. The upper surface of the combined layer may include an upper surface of the semiconductor layer and an upper surface of the polishing stop layer. The method may further include selectively polishing the semiconductor layer, based on applying a slurry composition to the upper surface of the combined layer, the slurry composition including a compound composition and polishing particles, the compound composition including a sulfonate compound and a terminal amine group-including compound.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION OF THE EMBODIMENTS

Figure 1:
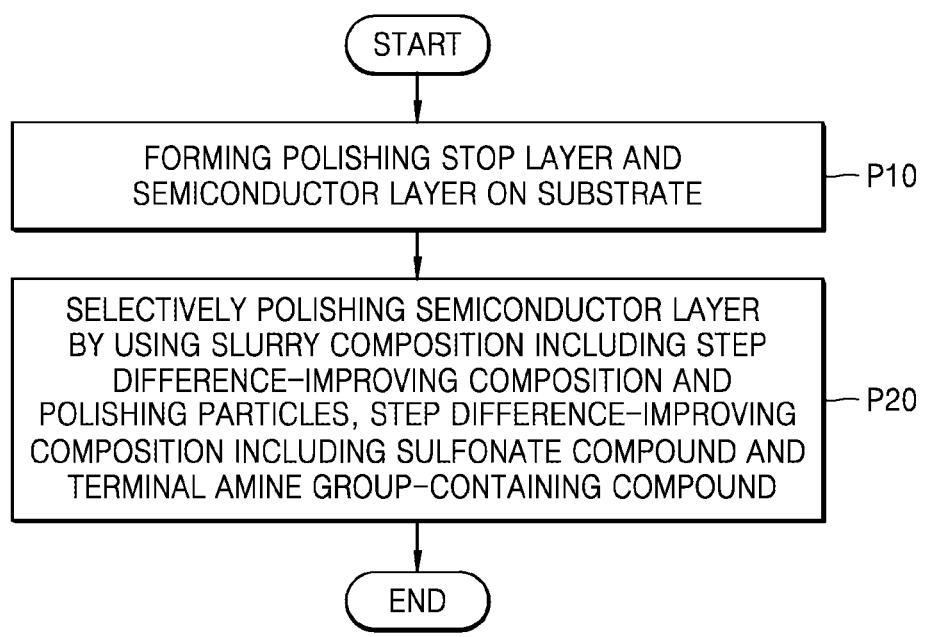
FIG. 1 is a flowchart of a method of fabricating an integrated circuit device, according to some example embodiments.

Hereinafter, example embodiments of the inventive concepts will be described in detail with reference to the accompanying drawings. Like components will be denoted by like reference numerals throughout the specification, and overlapping descriptions thereof will be omitted.

Specific terms may be used throughout the specification, and the meanings thereof are as follows. As used herein, the term "about" means a range of ±10% of the stated value. As used herein, the term "alkyl group" refers to linear, branched, or cyclic alkyl groups. Examples of the linear alkyl groups may include methyl, ethyl, propyl, butyl groups, and the like, without being limited thereto. Examples of the branched alkyl groups may include a t-butyl group, without being limited thereto. Examples of the cyclic alkyl groups may include cyclopropyl, cyclopentyl, cyclohexyl groups, and the like, without being limited thereto. As used herein, the term "arylamine" refers to C6 to C40 arylamines.

FIG. 1 is a flowchart of a method of fabricating an integrated circuit device, according to some example embodiments. FIG. 2A, FIG. 2B, FIG. 2C, FIG. 2D, FIG. 2E, FIG. 2F, and FIG. 2G are cross-sectional views of main components shown according to a process order in order to explain a method of fabricating an integrated circuit device, according to some example embodiments A method of fabricating an integrated circuit device 100 (see FIG. 2G) will be described with reference to FIGS. 1 and 2A to 2G.

Figure 2A:
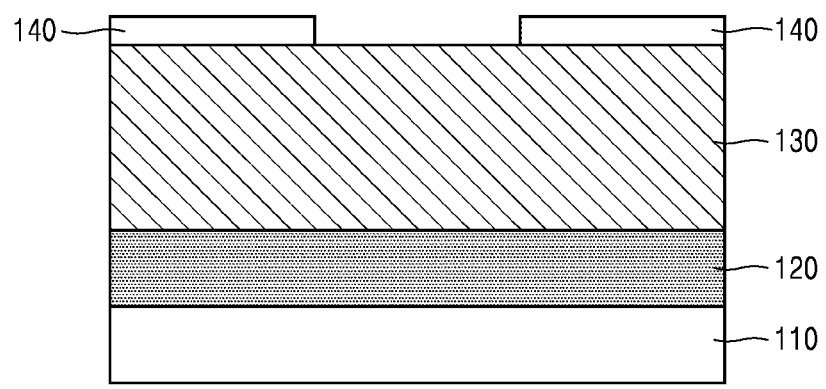
FIG. 2A, FIG. 2B, FIG. 2C, FIG. 2D, FIG. 2E, FIG. 2F, and FIG. 2G are cross-sectional views of main components shown according to a process order in order to explain a method of fabricating an integrated circuit device, according to some example embodiments.
Figure 2B:
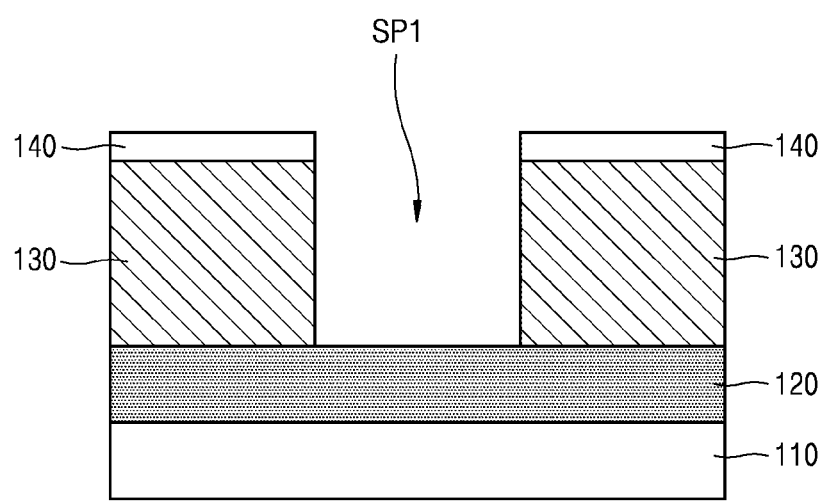
Figure 2C:
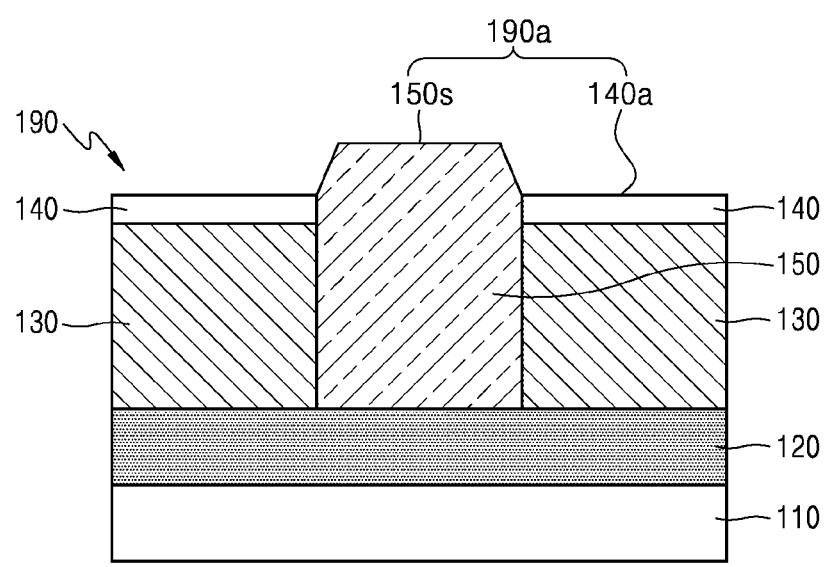

FIGS. 2A to 2C are cross-sectional views for explaining exemplary processes for forming a polishing stop layer and a semiconductor layer on a substrate, according to a process P10 of FIG. 1.

Referring to FIG. 2A, a stress relaxed buffer layer 120 is formed on a substrate 110, and a first semiconductor layer 130 is formed on the stress relaxed buffer layer 120. Next, a mask pattern 140 is formed on the first semiconductor layer 130. The mask pattern 140 may be referred to herein as a polishing stop layer.

In some embodiments, the substrate 110 may include silicon (Si). The substrate 110 may be a bulk Si substrate or a Si epitaxial layer. The substrate 110 may be a p-type Si substrate, an n-type Si substrate, or an impurity-undoped Si substrate.

In some embodiments, the substrate 110 may have a silicon-on-insulator (SOI) structure. In some embodiments, the substrate 110 may include a conductive region, for example, an impurity-doped well, or an impurity-doped structure.

The stress relaxed buffer layer 120 may include one of SiGe, Ge, and a Group III-V compound. The Group III-V compound may include one of gallium arsenide antimonide (GaAsSb), indium gallium arsenide (InGaAs), indium antimonide (InSb), gallium antimonide (GaSb), and indium arsenide (InAs).

In some embodiments, the stress relaxed buffer layer 120 may include a SiGe layer containing Ge at a relatively low concentration. In some embodiments, the stress relaxed buffer layer 120 may include a SiGe layer containing about 15 atom % to about 20 atom % of Ge.

The stress relaxed buffer layer 120 may be formed by an epitaxial growth process.

The first semiconductor layer 130 may include an epitaxially-grown Si or SiC layer, without being limited thereto.

Referring to FIG. 2B, the first semiconductor layer 130 may be etched by using the mask pattern 140 as an etch mask, thereby forming a space SP1 exposing the stress relaxed buffer layer 120.

The mask pattern 140 may include a silicon nitride layer, a silicon oxide layer, or combinations thereof, without being limited thereto.

Referring to FIG. 2C, a second semiconductor layer 150 is formed in the space SP1 and fills the space SP1.

To form the second semiconductor layer 150, a selective epitaxial growth process may be used. The second semiconductor layer 150 may have an upper surface 150s that is at a higher level than ("elevated above") an upper surface 140a of the mask pattern 140, and thus may protrude upwards from the mask pattern 140. At least the second semiconductor layer 150 and the mask pattern 140 may comprise a combined layer 190 with an upper surface 190a, where the upper surface 190a includes an upper surface 140a of the mask pattern 140 and an exposed upper surface 150s of the second semiconductor layer 150.

The second semiconductor layer 150 may include at least one of a Group IV material and a Group III-V material.

The Group IV material may be selected from among Si and Ge. In some embodiments, the second semiconductor layer 150 may include a Ge-containing layer having a higher Ge content than the stress relaxed buffer layer 120. For example, the second semiconductor layer 150 may include a SiGe layer containing about 30 atom % to about 45 atom % of Ge.

In some example embodiments, the second semiconductor layer 150 may include a binary, ternary, or quaternary Group III-V compound including at least one Group III element and at least one Group V element. The Group III-V compound may be a compound including at least one element of In, Ga, and Al as a Group III element and at least one element of As, P, and Sb as a Group V element. For example, the Group III-V compound may be selected from among InP, $In_zGa_{1-z}As$ (0≤z≤1), and $Al_zGa_{1-z}As$ (0≤z≤1). The binary Group III-V compound may be, for example, one of InP, GaAs, InAs, InSb, and GaSb. The ternary Group III-V compound may be one of InGaP, InGaAs, AlInAs, InGaSb, GaAsSb, and GaAsP.

However, the Group III-V compound and the Group IV material, which may be used for the integrated circuit device according to the inventive concepts, are not limited to the examples set forth above. The Group III-V compound and the Group IV material may be used as channel materials allowing low-power high-speed transistors to be made. A high-performance CMOS may be formed by using the Group III-V compound and the Group IV material, which have a higher electron mobility than a Si substrate.

In the resulting product of FIG. 2C, the mask pattern 140 may correspond to the polishing stop layer in the process P10 of FIG. 1, and the second semiconductor layer 150 may correspond to the semiconductor layer in the process P10 of FIG. 1.

Figure 2D:
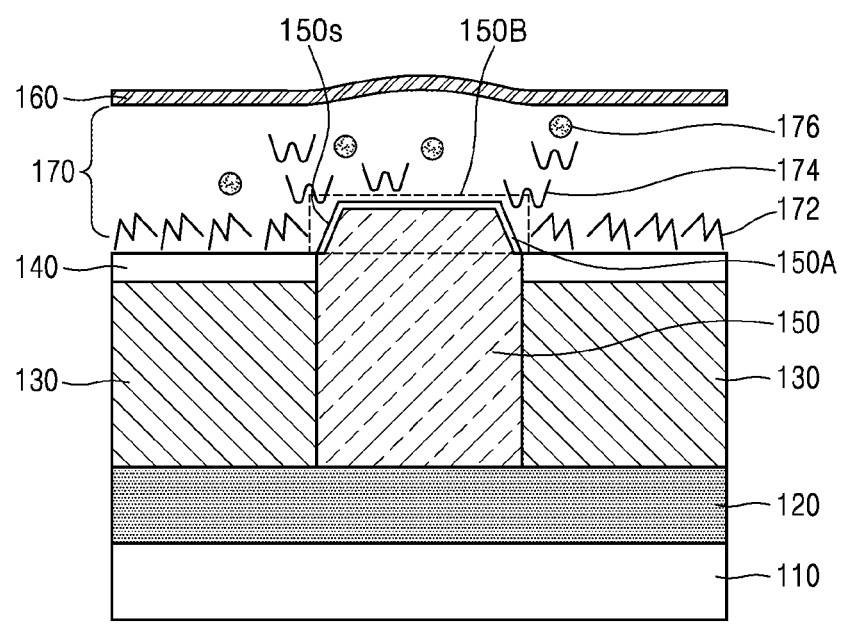
Figure 2E:
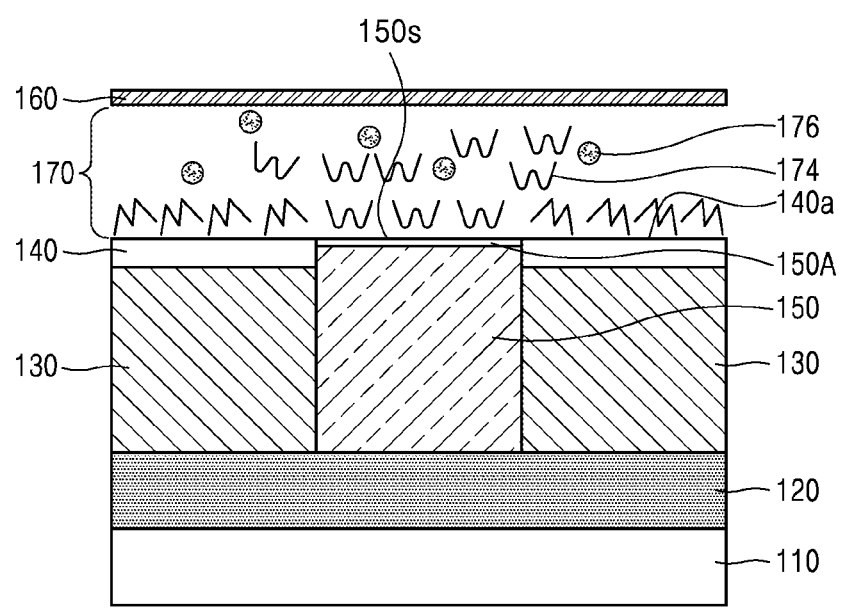

FIGS. 2D and 2E are cross-sectional views for explaining exemplary processes for selectively polishing the semiconductor layer from a surface, which simultaneously exposes the polishing stop layer (e.g., mask pattern 140) and the semiconductor layer (e.g., second semiconductor layer 150), by using a slurry composition including a compound composition and polishing particles, the compound composition including a sulfonate compound and a terminal amine group-including compound, according to a process P20 of FIG. 1.

Referring to FIG. 2D, the second semiconductor layer 150 is selectively polished by using a polishing pad 160 and using a slurry composition 170 including a compound composition 172 and 174 and polishing particles 176. In some example embodiments, the slurry composition includes a uniform or substantially uniform mixture of the at least one sulfonate compound 172, the at least one terminal-amine-group-including compound 174 and the polishing particles 176. Here, the second semiconductor layer 150 is selectively polished by using the mask pattern 140 as the polishing stop layer, such that the elements polished are at least partially restricted to the elements exposed relative to the polishing stop layer. In FIG. 2D, the upper portion 150B of the second semiconductor layer 150 protrudes from the mask pattern 140. Thus, the upper portion 150B is exposed relative to the polishing stop layer. The selective polishing of the semiconductor layer 150 may include a polishing that is restricted to polishing the exposed upper portion 150B of the second semiconductor layer 150.

The compound composition 172 and 174 may be configured to suppress the occurrence of an undesired step difference between a polishing target layer and the polishing stop layer, and may include at least one sulfonate compound 172 and at least one terminal-amine-group-including compound 174. The polishing target layer may be one or more elements that are exposed by the polishing stop layer (e.g., upper portion 150B of the second semiconductor layer 150).

In some embodiments, the at least one sulfonate compound 172, included in the compound composition 172 and 174, may be an anionic sulfonate compound having a pKa of 4 or less. As used herein, the expression "material having a pKa of 4 or less" refers to materials containing one or more acidic hydrogens and having a dissociation constant of 4 or less, the dissociation constant being denoted by pKa. Therefore, materials containing only one acidic hydrogen as well as materials containing two or more acidic hydrogens may fall within acidic materials of the slurry composition 170. The materials containing two or more acidic hydrogens, for example, sulfuric acid, phosphoric acid, succinic acid, citric acid, and the like, may have a plurality of sequential pKa values, which respectively correspond to sequential dissociation of hydrogens. For example, phosphoric acid has three acidic hydrogens and may have three pKa values, that is, 2.1, 7.2, and 12.4, which respectively correspond to dissociation of first, second, and third hydrogens. In materials containing a plurality of acidic hydrogens, at least one pKa value may range from −10 to 4.

In some embodiments, each of the at least one sulfonate compound 172 and the at least one terminal-amine-group-including compound 174 may include a polymer having a molecular weight of 1,000 to 1,000,000. In some embodiments, if the molecular weight of at least one of the at least one sulfonate compound 172 and the at least one terminal-amine-group-including compound 174 is less than 1,000, an unwanted step difference may be caused by the occurrence of dishing and erosion in and around the polishing target layer. In some other examples, if the molecular weight of at least one of the at least one sulfonate compound 172 and the at least one terminal-amine-group-including compound 174 is greater than 1,000,000, deterioration of dispersion stability of the polishing particles may occur due to agglomeration of the polishing particles in the slurry composition 170.

In some embodiments, the at least one sulfonate compound 172 may include a polystyrene sulfonate. In some example embodiments, the at least one sulfonate compound 172 may include at least one selected from among C10 to C13 alkylbenzene sulfonates, dodecylbenzene sulfonates, α-olefin sulfonates, ligno sulfonates, trimethylsilyl trifluoromethanesulfonate, guaiazulene sulfonates, diisopropyl naphtalene sulfonates, petroleum sulfonates, and toluene sulfonates.

In some embodiments, the at least one terminal-amine-group-including compound 174 may include an amine polymer or an amide polymer. For example, the at least one terminal-amine-group-including compound 174 may include at least one selected from among polyacrylamides, polydimethylacrylamides, poly-N-isopropylamides, polyvinylacetamides, polyoxyethyleneamides, C6 to C40 polyarylamines, poly(N-methylvinylamines), poly(N-methyldiarylamines), polyoxypropylenediamines, polyvinylamines, and polyetheramines.

The compound composition 172 and 174 may be present in an amount of about 0.01 wt % to about 10 wt % in the slurry composition 170. If the amount of the compound composition 172 and 174 is less than 0.01 wt %, an unwanted step difference may be caused by the occurrence of dishing and erosion in and around the polishing target layer. If the amount of the compound composition 172 and 174 is greater than 10 wt %, deterioration of dispersion stability of the polishing particles may occur due to agglomeration of the polishing particles in the slurry composition 170.

The polishing particles 176 may include a metal oxide, an organic or inorganic material-coated metal oxide, or a colloidal metal oxide.

In some embodiments, the metal oxide constituting the polishing particles 176 may include a material selected from among silica, ceria, zirconia, alumina, titania, barium titania, germania, mangania, and magnesia. For example, the polishing particles 176 may include silica.

The polishing particles 176 may have an average particle diameter of about 10 nm to about 300 nm. If the average particle diameter of the polishing particles 176 is less than 10 nm, a polishing rate of the polishing target layer may be reduced, and it may be difficult to secure a selectivity of the polishing target layer. If the average particle diameter of the polishing particles 176 is greater than 300 nm, it may be difficult to control surface defects, the polishing rate, and the polishing selectivity of the polishing target layer.

The polishing particles 176 may be present in an amount of about 0.1 wt % to about 10 wt %, in some embodiments, about 0.1 wt % to about 5 wt %, for example, about 0.1 wt % to about 1 wt %, based on the total weight of the slurry composition 170. In a specific embodiment, the polishing particles 176 may be present in an amount of about 0.1 wt % to about 0.5 wt %, based on the total weight of the slurry composition 170.

The slurry composition 170, which may be used for the integrated circuit device according to the inventive concepts, may exhibit excellent polishing performance for the polishing target layer even when including a relatively low amount of the polishing particles 176. For example, the polishing particles 176 may exhibit excellent polishing performance for the polishing target layer even when the polishing particles 176 are present in a relatively low amount of about 0.1 wt % to about 0.5 wt % based on the total weight of the slurry composition 170. If the amount of the polishing particles 176 is less than 0.1 wt %, the polishing rate may be deteriorated, and if the amount of the polishing particles 176 is greater than 10 wt %, defects may be generated on a polishing target surface due to the polishing particles 176.

The polishing particles 176 may have a spherical shape, a conical shape, a needle shape, or a plate shape. For example, as shown in FIG. 2D, the polishing particles 176 may have a spherical shape. However, the inventive concepts are not limited to such shapes of the polishing particles.

The slurry composition 170 may further include at least one selected from among an oxidant, a free radical supplying agent, an auxiliary oxidant, and a pH regulator. In addition, the slurry composition 170 may include water as a solvent. The water may include deionized water or distilled water.

The oxidant may include at least one material selected from among hydrogen peroxide, ferric nitrate, potassium iodate, potassium permanganate, ammonium chlorite, ammonium chlorate, ammonium iodate, ammonium perborate, ammonium perchlorate, ammonium periodate, tetramethylammonium chlorite, tetramethylammonium chlorate, tetramethylammonium iodate, tetramethylammonium perborate, tetramethylammonium perchlorate, tetramethylammonium periodate, 4-methylmorpholine-N-oxide, pyridine-N-oxide, and urea hydrogen peroxide.

The polishing rate of the polishing target layer (e.g., upper portion 150B of the second semiconductor layer 150) may be adjusted according to an amount of the oxidant in the slurry composition 170. The oxidant may be present in an amount of about 0.1 wt % to about 10 wt % based on the total weight of the slurry composition 170. In some embodiments, the oxidant may be present in an amount of about 0.1 wt % to about 5 wt %, for example, about 0.1 wt % to about 3 wt %, based on the total weight of the slurry composition 170. If the amount of the oxidant in the slurry composition 170 is less than 0.1 wt %, the polishing rate of the polishing target layer may be deteriorated, and if the amount of the oxidant in the slurry composition 170 is greater than 10 wt %, the polishing target layer may suffer from local erosion due to excessive oxidation or erosion of the polishing target layer, and thus may exhibit deteriorated properties. The polishing rate may refer to a rate at which the polishing target layer is removed due to polishing. For example, the polishing rate may be refer to a rate of decrease of one or more dimensions of the polishing target layer, a rate of decrease of a volume of the polishing target layer, some combination thereof, or the like.

The free radical supplying agent in the slurry composition 170 may improve an oxidation capability of the oxidant.

In some embodiments, the free radical supplying agent may include an organic acid. In some embodiments, the free radical supplying agent may include at least one selected from among formic acid, picolinic acid, nicotinic acid, isonicotinic acid, fusaric acid, dinicotinic acid, dipicolinic acid, lutidinic acid, quinolinic acid, glutamic acid, alanine, glycine, cystine, histidine, asparagine, guanidine, hydrazine, ethylenediamine, acetic acid, benzoic acid, oxalic acid, succinic acid, malic acid, maleic acid, malonic acid, citric acid, lactic acid, tricarballylic acid, tartaric acid, aspartic acid, glutaric acid, adipic acid, suberic acid, fumaric acid, phthalic acid, pyridinecarboxylic acid, and salts thereof.

The free radical supplying agent may be present in an amount of about 0.01 wt % to about 10 wt % in the slurry composition 170. In some embodiments, the free radical supplying agent may be present in an amount of about 0.01 wt % to about 5 wt %, for example, about 0.1 wt % to about 2 wt %, in the slurry composition 170. If the amount of the free radical supplying agent in the slurry composition 170 is less than 0.01 wt %, the polishing rate of the polishing target layer may be too low, and if the amount of the free radical supplying agent in the slurry composition 170 is greater than 10 wt %, the polishing target layer may suffer from surface defects.

The auxiliary oxidant in the slurry composition 170 may control the polishing rate of the polishing target layer. In some embodiments, the polishing rate of the polishing target layer may increase with the increasing amount of the auxiliary oxidant in the slurry composition 170, such that the polishing rate may be proportional to the amount of auxiliary oxidant in the slurry composition 170.

In some embodiments, the auxiliary oxidant may include a nitrate. Examples of the auxiliary oxidant including a nitrate may include ammonium nitrate, potassium nitrate, ferric nitrate, urea nitrate, and the like. However, the inventive concepts are not limited to the examples set forth above, and any material including a nitrate may be used.

The slurry composition 170 includes the auxiliary oxidant and the free radical supplying agent, whereby control of the polishing rate of a Group IV material such as Ge or SiGe or a Group III-V compound such as GaN, GaP, or GaAs may be facilitated. In some embodiments, the polishing rate of the polishing target layer may be adjusted according to the amount of the oxidant in the slurry composition 170. In some example embodiments, the polishing rate of the polishing target layer may be adjusted according to the amounts of the auxiliary oxidant and/or the free radical supplying agent in the slurry composition 170.

The auxiliary oxidant may be present in an amount of about 0.01 wt % to about 10 wt % based on the total weight of the slurry composition 170. In some embodiments, the auxiliary oxidant may be present in an amount of about 0.01 wt % to about 5 wt %, for example, about 0.1 wt % to about 2.5 wt %, in the slurry composition 170. If the amount of the auxiliary oxidant in the slurry composition 170 is less than 0.01 wt %, the polishing rate of the polishing target layer may be too low, and if the amount of the auxiliary oxidant in the slurry composition 170 is greater than 10 wt %, the polishing target layer may exhibit deteriorated properties due to excessive oxidation or erosion of the polishing target layer.

The pH regulator may serve to adjust the dispersity of the polishing particles by adjusting the pH of the slurry composition 170.

In some embodiments, the pH regulator may include at least one selected from among ammonia, potassium hydroxide, sodium hydroxide, magnesium hydroxide, rubidium hydroxide, cesium hydroxide, sodium hydrogen carbonate, sodium carbonate, triethanolamine, tromethamine, niacinamide, nitric acid, sulfuric acid, phosphoric acid, hydrochloric acid, acetic acid, citric acid, glutaric acid, gluconic acid, formic acid, lactic acid, malic acid, malonic acid, maleic acid, oxalic acid, phthalic acid, succinic acid, tartaric acid, ammonium methyl propanol (AMP), and tetramethylammonium hydroxide (TMAH).

The pH regulator may be included in the slurry composition 170 such that the slurry composition 170 may have a pH of about 3 to about 5, which corresponds to an acidic range. In some embodiments, the pH regulator may be present in an amount of about 0.01 wt % to about 1 wt % in the slurry composition 170. In some cases, if the pH of the slurry composition 170 is in an alkaline range, significant loss of the polishing target layer may occur after polishing due to severe dissolution of a Ge component included in the polishing target layer, for example, a SiGe layer.

When the pH of the slurry composition 170 is in a range of 3 to 5, which corresponds to an acidic range, the polishing may be stopped at the mask pattern used as the polishing stop layer, for example, at the mask pattern including a silicon nitride layer, due to a combination of actions of the at least one sulfonate compound 172 and the at least one terminal-amine-group-including compound 174, which constitute the compound composition 172 and 174 in the slurry composition 170. In addition, the occurrence of an unwanted step difference between the polishing stop layer and the polishing target layer, for example, a semiconductor layer including a Group IV material such as SiGe, is suppressed, whereby a step difference-improving capability of the slurry composition 170 may be increased and/or maximized. For example, when a polishing process is performed by using the slurry composition 170, the at least one sulfonate compound 172, which is an anionic polymer, may be adsorbed onto the silicon nitride layer (e.g., mask pattern 140), which is the polishing stop layer, and the at least one terminal-amine-group-including compound 174, which is a cationic amide polymer, may be adsorbed onto the polishing target layer, that is, the semiconductor layer. Here, while suppressing the polishing of the silicon nitride layer by being adsorbed onto a surface of the silicon nitride layer, the anionic polymer may help the cationic polymer be adsorbed onto the polishing target layer. As such, due to the combination of actions of the at least one sulfonate compound 172 and the at least one terminal-amine-group-including compound 174, which constitute the compound composition 172 and 174, the occurrence of the step difference between the polishing target layer and the polishing stop layer may be suppressed when the polishing process is performed by using the slurry composition 170.

As shown in FIG. 2D, while the second semiconductor layer 150 is selectively polished by using the slurry composition 170, a portion of a surface 150s of the second semiconductor layer 150, which is exposed to the slurry composition 170, may be oxidized. That is, as a polished surface of the second semiconductor layer 150 is exposed to the slurry composition 170 while a polishing target surface 150s of the upper portion 150B of the second semiconductor layer 150 is polished, a surface oxide layer 150A may be consecutively formed on the polished surface 150s of the second semiconductor layer 150. In some embodiments, the polishing rate of the second semiconductor layer 150 using the slurry composition 170 may range from about 200 Å/min to about 1,500 Å/min, without being limited thereto.

In addition, while the second semiconductor layer 150 is selectively polished by using the slurry composition 170, the at least one sulfonate compound 172, for example, an anionic polystyrene sulfonate, may be mainly selectively adsorbed onto a cationic upper surface of the mask pattern 140, for example, a silicon nitride layer pattern. Thus, the slurry composition 170 includes a sufficient amount of the at least one sulfonate compound 172, whereby the polishing rate of the mask pattern 140 may be reduced as much as possible since the mask pattern 140 is protected from a polishing environment by the at least one sulfonate compound 172 adsorbed onto the surface of the mask pattern 140 during the polishing of the polishing target layer. Further, a hydrophobic surface of the second semiconductor layer 150, for example, a SiGe layer, which is the polishing target layer, attracts the at least one terminal-amine-group-including compound 174, for example, a polyacrylamide, having hydrophobicity, due to an affinity between hydrophobic materials, whereby the surface of the SiGe layer may be passivated by the at least one terminal-amine-group-including compound 174. Furthermore, due to the at least one sulfonate compound 172 adsorbed onto the mask pattern 140, the at least one terminal-amine-group-including compound 174 is more easily led onto the second semiconductor layer 150, whereby the adsorption of the at least one sulfonate compound 172 onto the second semiconductor layer 150 or the attraction of the at least one sulfonate compound 172 toward the second semiconductor layer 150 may be further accelerated.

In polishing the second semiconductor layer 150, which is the polishing target layer, by using the polishing pad 160 and the slurry composition 170, a difference in polishing pressure applied by the polishing pad 160 according to degrees of protrusion and/or subsidence of the second semiconductor layer 150 from the mask pattern 140 surface 140a, for example, the SiGe layer may be used. That is, when the second semiconductor layer 150 protrudes higher than the upper surface 140a of the mask pattern 140, the polishing may be accelerated due to a high pressure applied by the polishing pad 160, and thus, a portion of the second semiconductor layer 150, which protrudes higher than the upper surface 140a of the mask pattern 140, may be subsided first.

In the manner as set forth above, the subsidence of the second semiconductor layer 150 continues, whereby, as shown in FIG. 2E, the upper surface 150s of the second semiconductor layer 150 may be at an approximately equal or similar level to the upper surface 140a of the mask pattern 140. In this state, the pressure of the polishing pad 160 may not be applied to the second semiconductor layer 150 any more due to the upper surface 140a of the mask pattern 140 being coplanar or substantially coplanar with the upper surface 150s of the second semiconductor layer 150. In such a state, the polishing of the 150 second semiconductor layer by the slurry composition 170 is reduced, whereby the occurrence of dishing on the surface 150s of the second semiconductor layer 150 may be suppressed. Furthermore, the surface 150s of the second semiconductor layer 150, for example, the SiGe layer, is passivated by the at least one terminal-amine-group-including compound 174 which has hydrophobicity and is adsorbed onto the surface 150s of the second semiconductor layer 150, whereby the second semiconductor layer 150 may be protected from being mechanically polished by the polishing pad 160.

Figure 2F:
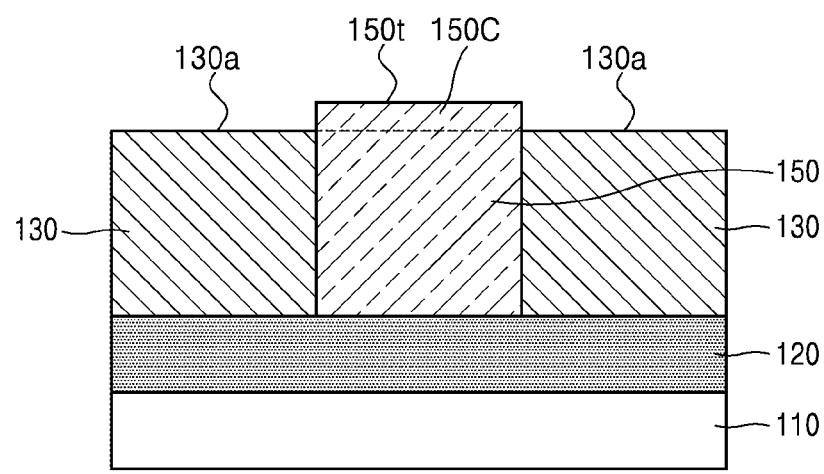

Referring to FIG. 2F, the mask pattern 140 and the surface oxide layer 150A (see FIG. 2E), which remains on the surface of the second semiconductor layer 150 polished during the polishing process, are removed, thereby exposing an upper surface 130a of the first semiconductor layer 130 and the upper surface 150t of the second semiconductor layer 150 that has been polished.

Figure 2G:
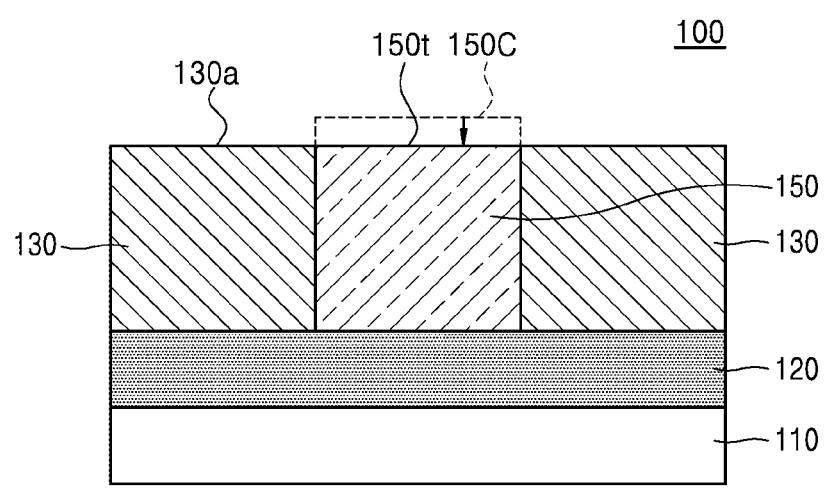

Referring to FIG. 2G, the upper surface 130a of the first semiconductor layer 130 and the upper surface 150t of the second semiconductor layer 150 may be at an approximately equal or similar level by performing an etchback process or performing a polishing process using a slurry for polishing, which has similar polishing selectivities with respect to the first semiconductor layer 130 and the second semiconductor layer 150, such that a protruding portion 150C of the second semiconductor layer 150 may be removed, the protruding portion 150C protruding from the upper surface 130a of the first semiconductor layer 130.

The method of fabricating the integrated circuit device has been described with reference to FIGS. 1 and 2A to 2G, the method including the process of polishing the second semiconductor layer 150. The method of fabricating the integrated circuit device, according to embodiments, allows independent control of the amount of the at least one sulfonate compound 172 and the amount of the at least one terminal-amine-group-including compound 174 in the compound composition 172 and 174 included in the slurry composition, thereby effectively polishing the second semiconductor layer 150, which includes various materials, with reducing and/or minimizing dishing and a step difference between the second semiconductor layer 150 and the polishing stop layer around the second semiconductor layer 150.

FIG. 3A, FIG. 3B, FIG. 3C, FIG. 3D, FIG. 3E, FIG. 3F, FIG. 3G, FIG. 3H, FIG. 3I, FIG. 3J, and FIG. 3K are cross-sectional views shown according to a process order in order to explain a method of fabricating an integrated circuit device, according to some example embodiments. In FIGS. 3A to 3K, the same reference numerals as in FIGS. 2A to 2G denote the same members, and descriptions thereof will be omitted.

Figure 3A:
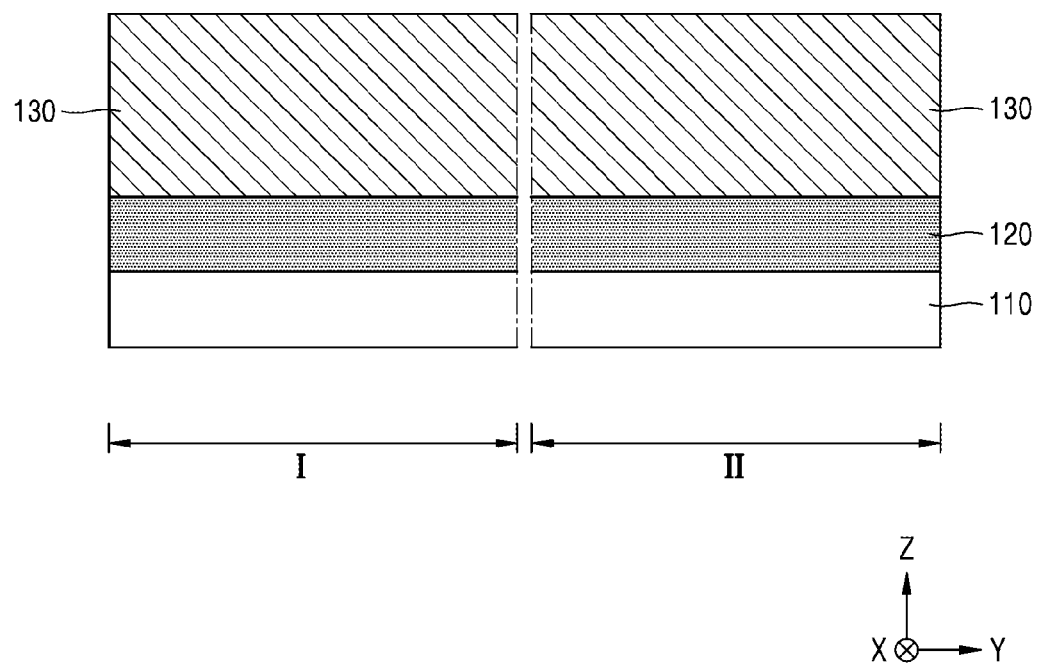
FIG. 3A, FIG. 3B, FIG. 3C, FIG. 3D, FIG. 3E, FIG. 3F, FIG. 3G, FIG. 3H, FIG. 3I, FIG. 3J, and FIG. 3K are cross-sectional views shown according to a process order in order to explain a method of fabricating an integrated circuit device, according to some example embodiments.

Referring to FIG. 3A, the substrate 110 including a first region I and a second region II is prepared.

The first region I and the second region II of the substrate 110 refer to different regions of the substrate 110, and may be regions requiring different threshold voltages. For example, the first region I may be an NMOS region, and the second region II may be a PMOS region.

In the same method as described with reference to FIG. 2A, the stress relaxed buffer layer 120 and the first semiconductor layer 130 are sequentially formed in the stated order on the first region I and the second region II of the substrate 110.

In some embodiments, the stress relaxed buffer layer 120 may include a SIGe layer containing about 15 atom % to about 20 atom % of Ge. The first semiconductor layer 130 may include Si.

Figure 3B:
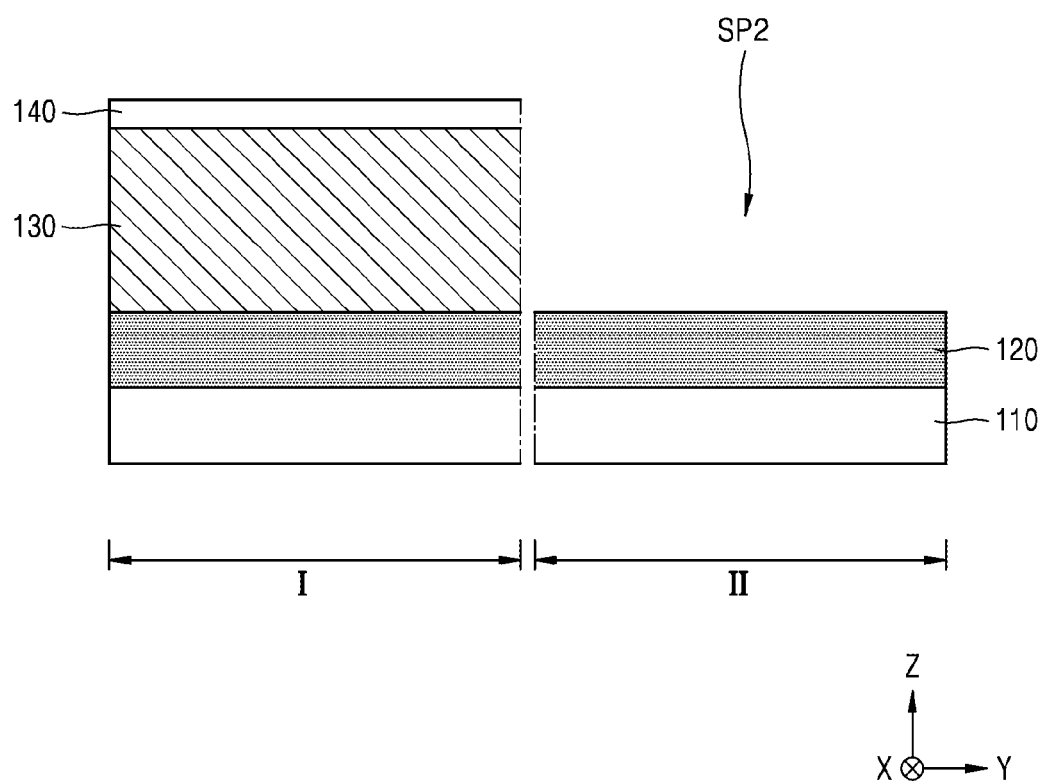

Referring to FIG. 3B, the mask pattern 140 is formed on the first semiconductor layer 130 in the first region I and covers the first semiconductor layer 130 in the first region I, and the first semiconductor layer 130 in the second region II is etched by using the mask pattern 140 as an etch mask, thereby forming a recess space SP2 exposing the stress relaxed buffer layer 120 in the second region II.

In some embodiments, a portion of the stress relaxed buffer layer 120, which is exposed after the etching of the first semiconductor layer 130, may be further etched by over-etch.

In some embodiments, the mask pattern 140 may include a silicon nitride layer.

Figure 3C:
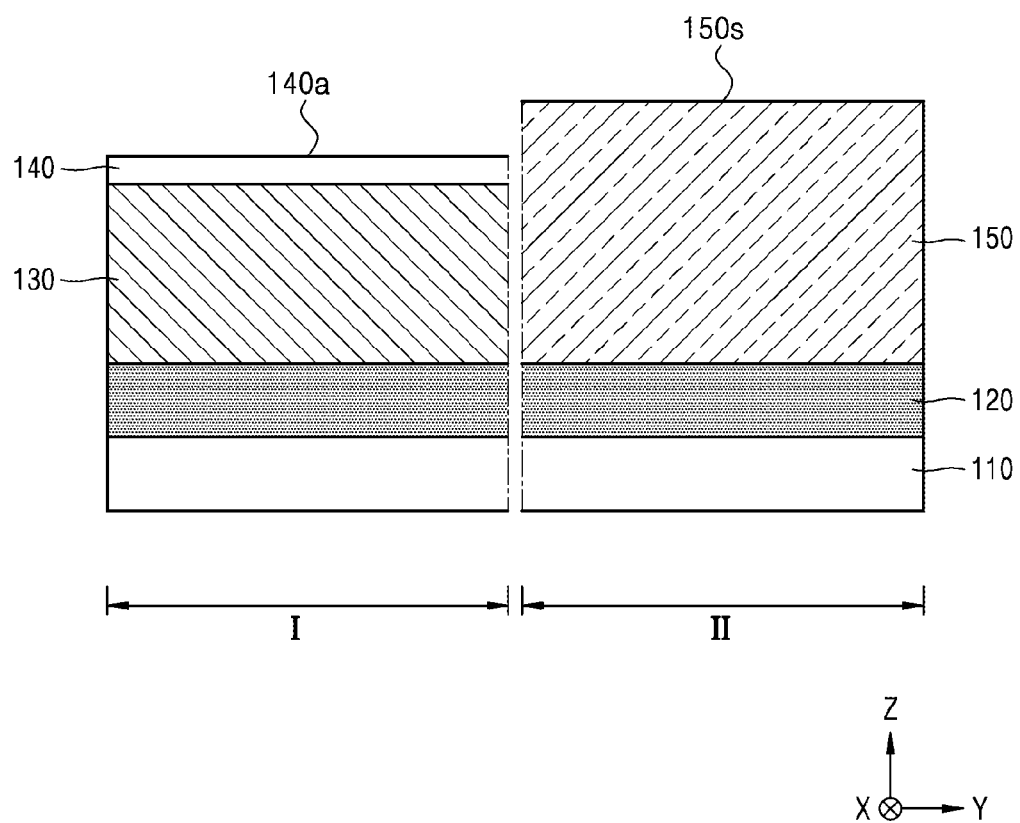

Referring to FIG. 3C, in the same method as set forth above with reference to FIG. 2C, the second semiconductor layer 150 is formed in the recess space SP2 and fills the recess space SP2.

The second semiconductor layer 150 may be formed by a selective epitaxial growth process. The selective epitaxial growth process may be performed such that the upper surface 150s of the second semiconductor layer 150 protrudes higher than the upper surface 140a of the mask pattern 140.

In some embodiments, the second semiconductor layer 150 may include a SiGe layer having a higher Ge content than the stress relaxed buffer layer 120. For example, the second semiconductor layer 150 may include a SiGe layer containing about 30 atom % to about 45 atom % of Ge.

Figure 3D:
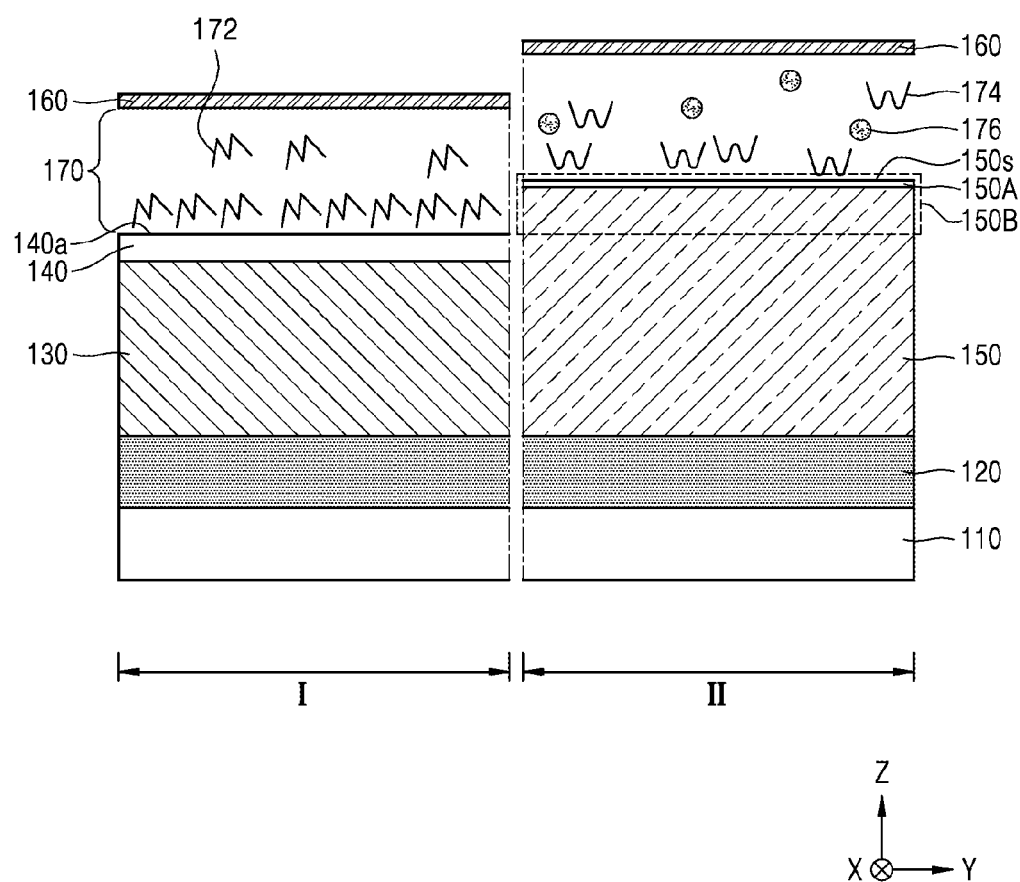
Figure 3E:
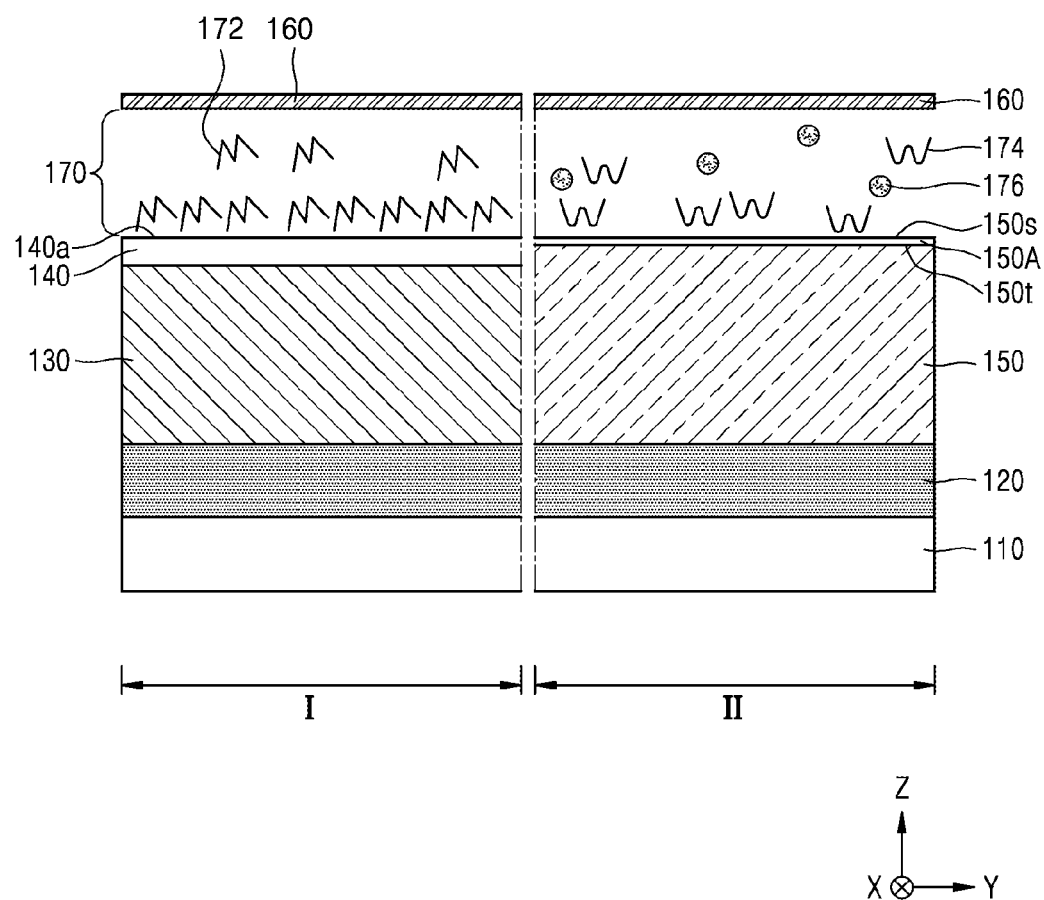

Referring to FIGS. 3D and 3E, the second semiconductor layer 150 is selectively polished from a surface simultaneously exposing the mask pattern 140, which is the polishing stop layer, and the second semiconductor 150, by using the slurry composition 170 including the compound composition 172 and 174 and the polishing particles 176, the compound composition 172 and 174 including the at least one sulfonate compound 172 and the at least one terminal-amine-group-including compound 174.

Descriptions of the slurry composition 170 including the compound composition 172 and 174 and the polishing particles 176 are the same as the descriptions made with reference to FIG. 2, the compound composition 172 and 174 including the at least one sulfonate compound 172 and the at least one terminal-amine-group-including compound 174.

In some embodiments, in the slurry composition 170, the at least one sulfonate compound 172 may be a polystyrene sulfonate, the at least one terminal-amine-group-including compound 174 may be a polyacrylamide, and the polishing particles 176 may be colloidal silica. In some embodiments, the slurry composition 170 may include hydrogen peroxide as an oxidant, include an organic acid, for example, formic acid, as a free radical supplying agent, and include a nitrate, for example, ammonium nitrate, as an auxiliary oxidant. The slurry composition 170 may further include a pH regulator. The pH of the slurry composition 170 may be maintained at about 3 to about 5 by the pH regulator.

While the second semiconductor layer 150 is polished by using the slurry composition 170, an anionic polymer, which is the at least one sulfonate compound 172, may be adsorbed onto the mask pattern 140 used as a polishing stop layer, and the at least one terminal-amine-group-including compound 174 may be adsorbed onto the surface of the second semiconductor layer 150. Here, while protecting the mask pattern 140 to suppress the polishing of the mask pattern 140, the anionic polymer adsorbed onto mask pattern 140 may help a cationic polymer, which constitutes the at least one terminal-amine-group-including compound 174, be adsorbed onto the second semiconductor layer 150, which is a polishing target layer.

As shown in FIG. 3D, during the selective polishing of the second semiconductor layer 150 using the slurry composition 170, as a polished surface of the second semiconductor layer 150 is exposed to the slurry composition 170 while a polishing target surface of the second semiconductor layer 150 is polished, the surface oxide layer 150A may be consecutively formed on the polished surface of the second semiconductor layer 150. The polishing target surface of the second semiconductor layer 150 may be some or all of the exposed surface 150s of the second semiconductor layer 150.

During the selective polishing of the second semiconductor layer 150 using the slurry composition 170, the at least one sulfonate compound 172, which is the anionic polymer, may be selectively adsorbed onto the upper surface of the mask pattern 140 having a cationic surface property. Thus, even though the slurry composition 170 includes a sufficient amount of the at least one sulfonate compound 172, since the mask pattern 140 is protected from a polishing environment by the at least one sulfonate compound 172 adsorbed onto the surface of the mask pattern 140 during the polishing of the second semiconductor layer 150, the polishing of the mask pattern 140 may be suppressed despite an increase of a polishing rate of the second semiconductor layer 150 which is the polishing target layer. Simultaneously, the at least one terminal-amine-group-including compound 174 having hydrophobicity may be attracted onto the hydrophobic surface of the second semiconductor layer 150, which is the polishing target layer, by an affinity between hydrophobic materials, and thus, the exposed surface 150s of the second semiconductor layer 150 may be passivated by the at least one terminal-amine-group-including compound 174. Here, due to the at least one sulfonate compound 172 adsorbed onto the mask pattern 140, the attraction of the at least one terminal-amine-group-including compound 174 toward the second semiconductor layer 150 may be further accelerated, and the at least one terminal-amine-group-including compound 174 may be more easily adsorbed onto the second semiconductor layer 150.

As shown in FIG. 3D, at an early stage of the polishing of the second semiconductor layer 150, while the surface 150s of the second semiconductor layer 150 protrudes higher than the upper surface 140a of the mask pattern 140, the polishing of the second semiconductor layer 150 may be accelerated due to a high pressure applied by the polishing pad 160. Thus, a portion 150B of the second semiconductor layer 150, which protrudes higher than the upper surface of the mask pattern 140, may be subsided first.

As shown in FIG. 3E, after the upper surface 150s of the second semiconductor layer 150 is at an approximately equal or similar level to the upper surface 140a of the mask pattern 140 by the continuous subsidence of the second semiconductor layer 150, the pressure of the polishing pad 160 may not be applied to the second semiconductor layer 150 any more due to the mask pattern 140. In this state, the polishing by the slurry composition 170 is reduced, whereby the occurrence of dishing on the surface 150s of the second semiconductor layer 150 may be suppressed. In particular, the surface 150s of the second semiconductor layer 150 is passivated by the at least one terminal-amine-group-including compound 174 having hydrophobicity, whereby the second semiconductor layer 150 may be protected from being mechanically polished by the polishing pad 160.

Figure 3F:
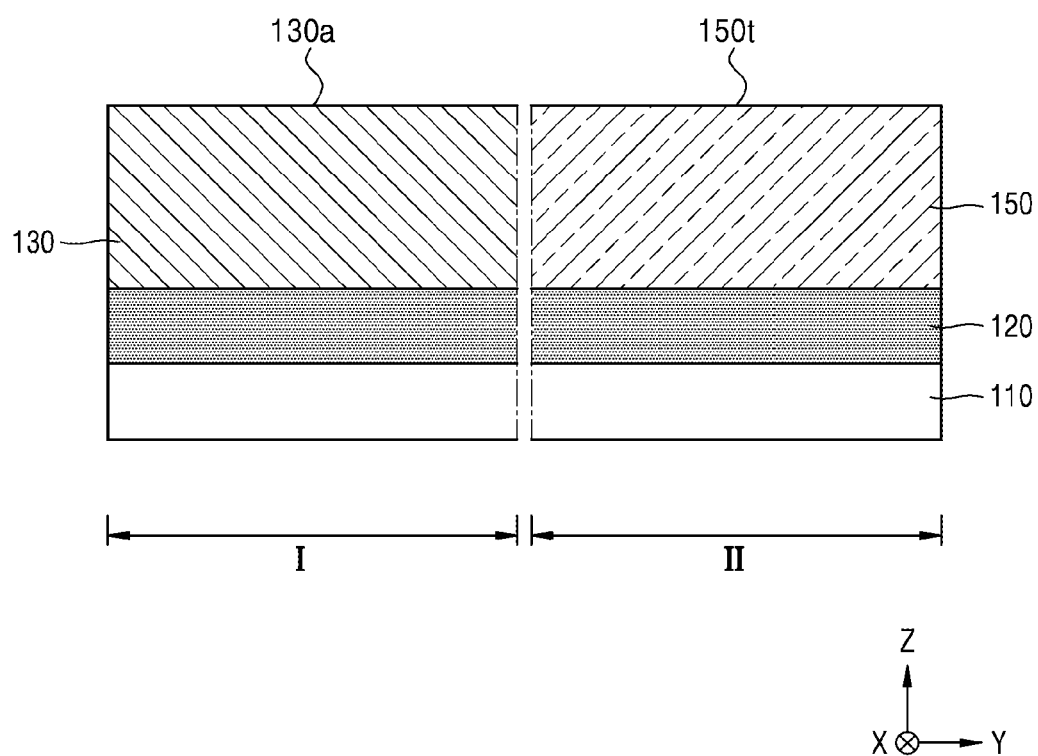

Referring to FIG. 3F, the upper surface 130a of the first semiconductor layer 130 is exposed by removing the mask pattern 140 (see FIG. 3E) in the first region I, and the upper surface of the second semiconductor layer 150, which has been polished, is exposed by removing the surface oxide layer 150A (see FIG. 3E) remaining on the surface 150t of the second semiconductor layer 150, which has been polished, in the second region II.

Next, as described with reference to FIG. 2E, the upper surface 130a of the first semiconductor layer 130 and the upper surface 150t of the second semiconductor layer 150 are at an approximately equal or similar level by performing an etchback process or performing a polishing process using a slurry for polishing, which has similar polishing selectivities with respect to the first semiconductor layer 130 and the second semiconductor layer 150.

Figure 3G:
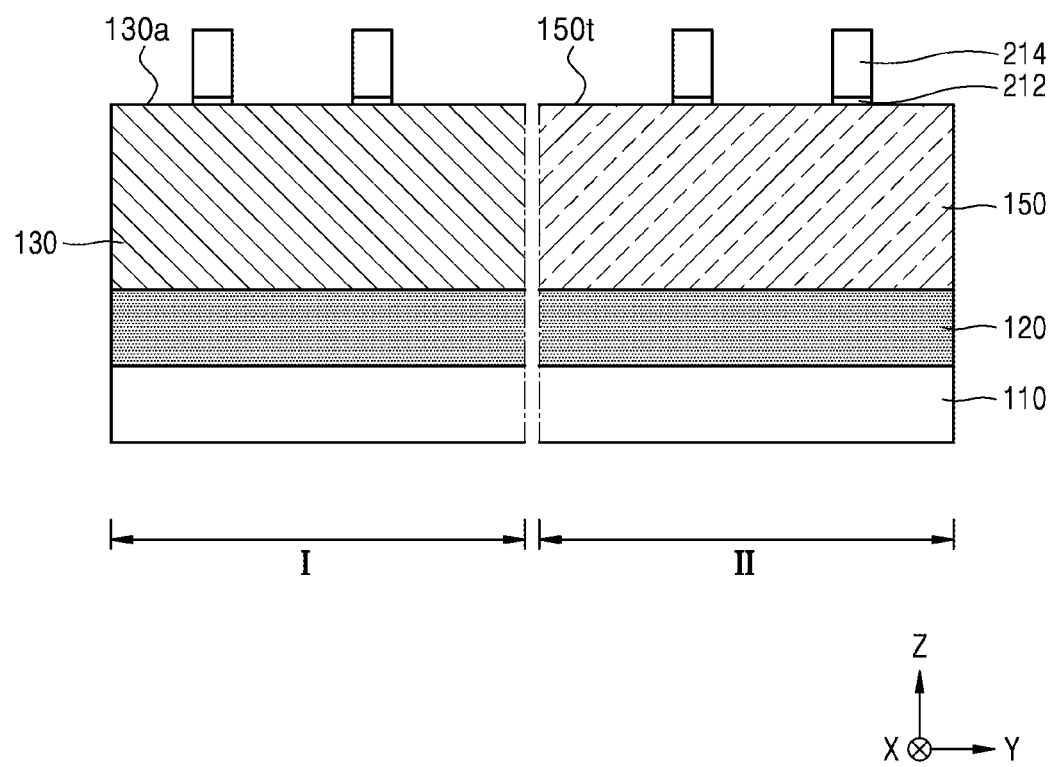

Referring to FIG. 3G, on the first region I and the second region II of the substrate 110, a plurality of pad oxide layer patterns 212 and a plurality of mask patterns 214 are formed on each of the upper surface 130a of the first semiconductor layer 130 and the upper surface 150t of the second semiconductor layer 150.

The plurality of pad oxide layer patterns 212 and the plurality of mask patterns 214 may extend parallel to each other along one direction (X direction) on the substrate 110.

In some embodiments, the plurality of pad oxide layer patterns 212 may include an oxide layer obtained by thermally oxidizing the upper surface 130a of the first semiconductor layer 130 and the upper surface 150t of the second semiconductor layer 150.

In some embodiments, the plurality of mask patterns 214 may include a silicon nitride layer, a silicon oxynitride layer, a spin-on-glass (SOG) layer, a spin-on-hardmask (SOH) layer, a photoresist layer, or combinations thereof, without being limited thereto.

Figure 3H:
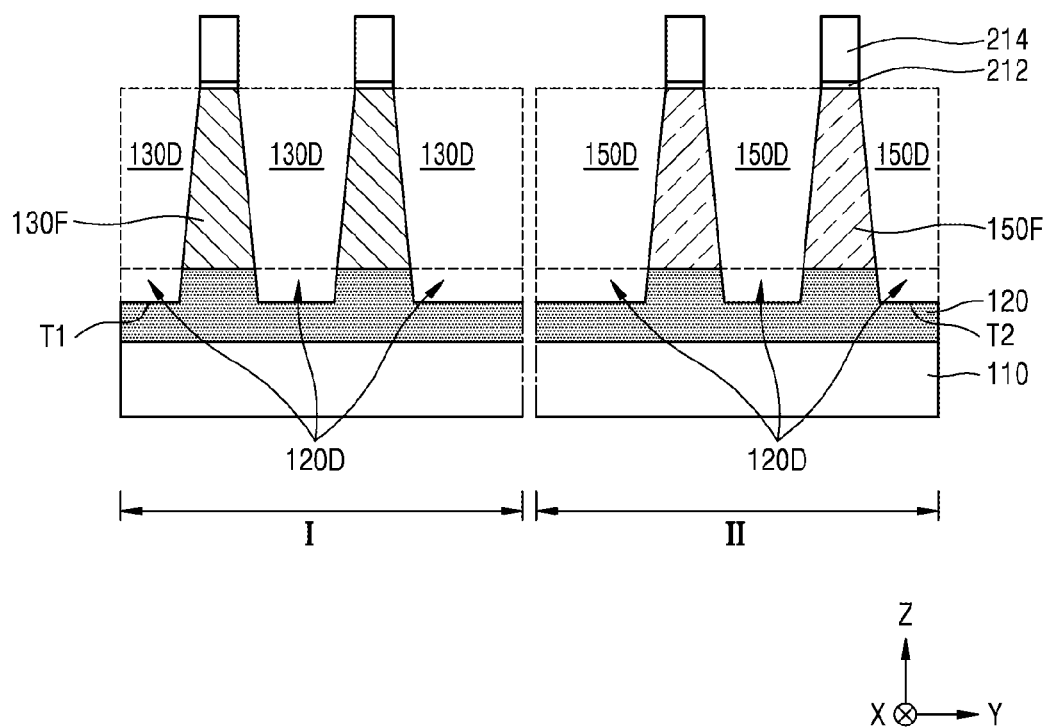

Referring to FIG. 3H, some areas 130D, 150D, 120D of each of the first semiconductor layer 130, the second semiconductor layer 150, and the stress relaxed buffer layer 120 in the first region I and the second region II are etched by using the plurality of mask patterns 214 as an etch mask, thereby forming a plurality of first and second trenches T1 and T2 on the substrate 110.

As the plurality of first and second trenches T1 and T2 are formed in the first region I and the second region II, a plurality of first and second fin-type active regions 130F and 150F may be obtained, the plurality of first and second fin-type active regions 130F and 150F protruding upwards along a direction (Z direction) perpendicular to a main plane of the substrate 110 and extending in one direction (X direction).

Figure 3I:
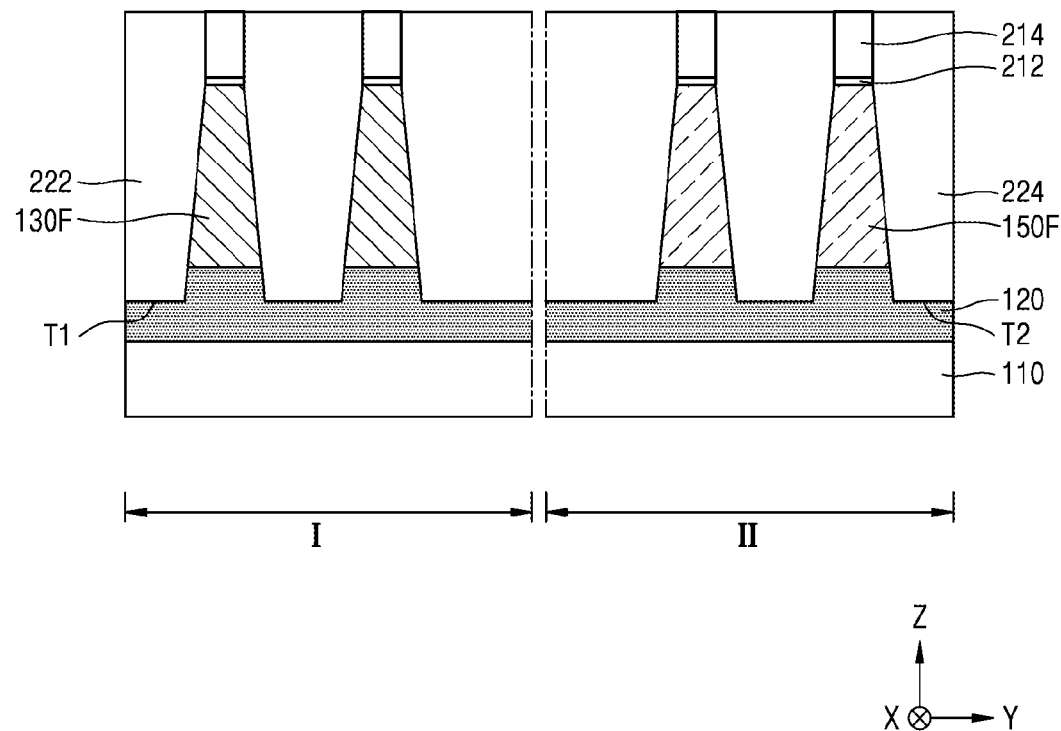

Referring to FIG. 3I, a first filling insulating layer 222 is formed in the plurality of first trenches T1 in the first region I and fills the plurality of first trenches T1 in the first region I, and a second filling insulating layer 224 is formed in the plurality of second trenches T2 in the second region II and fills the plurality of second trenches T2 in the second region II.

In some embodiments, the first filling insulating layer 222 and the second filling insulating layer 224 may be simultaneously formed and may include the same material layer. In some example embodiments, the first filling insulating layer 222 and the second filling insulating layer 224 may be sequentially formed. To form the first filling insulating layer 222 and the second filling insulating layer 224, an oxide, which fills an inside of each of the plurality of first trenches T1 and the plurality of second trenches T2, is deposited, followed by annealing the deposited oxide.

The first filling insulating layer 222 and the second filling insulating layer 224 may include an oxide layer formed by an FCVD process or a spin coating process. For example, each of the first filling insulating layer 222 and the second filling insulating layer 224 may include fluoride silicate glass (FSG), undoped silicate glass (USG), boro-phospho-silicate glass (BPSG), phospho-silicate glass (PSG), flowable oxide (FOX), plasma enhanced tetra-ethyl-ortho-silicate (PE-TEOS), or tonen silazene (TOSZ), without being limited thereto.

In some embodiments, the first filling insulating layer 222 may include a first insulating liner (not shown) covering exposed surfaces of the plurality of first fin-type active regions 130F in the first region I, and the second filling insulating layer 224 may include a second insulating liner (not shown) covering exposed surfaces of the plurality of second fin-type active regions 150F in the second region II. Each of the first insulating liner and the second insulating liner may be formed by an ISSG process, a thermal oxidation process, a UV oxidation process, an $O_2$ plasma oxidation process, a CVD process, or an ALD process. Each of the first insulating liner and the second insulating liner may have a thickness of about 10 Å to about 100 Å, without being limited thereto.

Figure 3J:
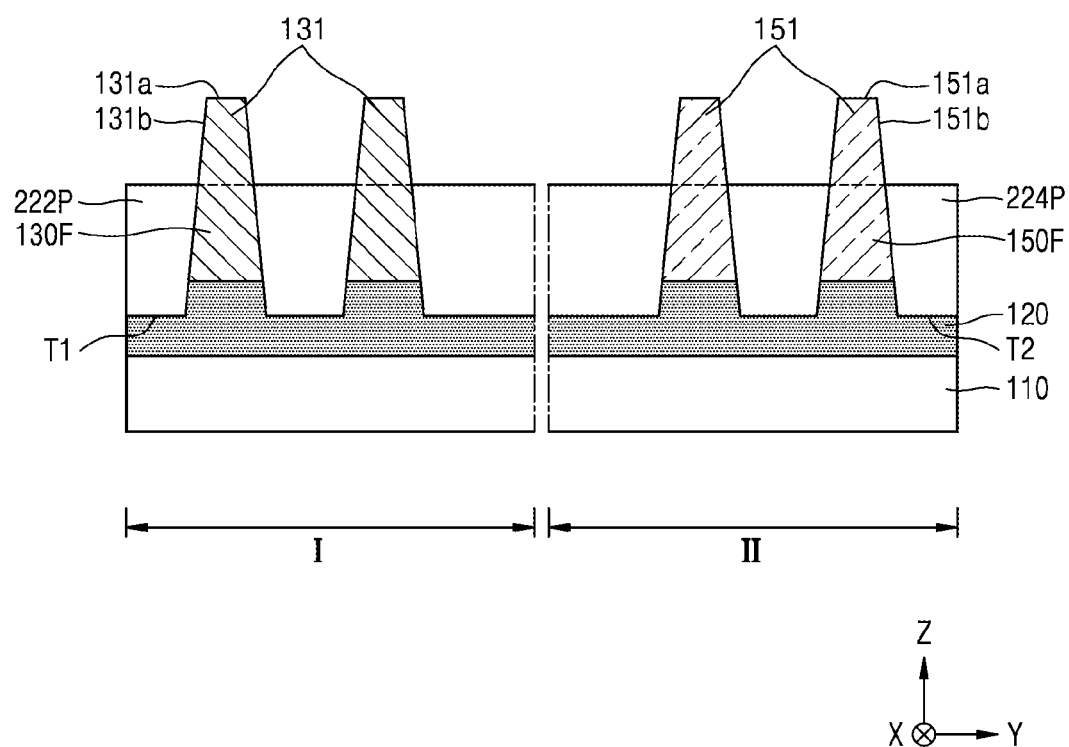

Referring to FIG. 3J, the plurality of mask patterns 214, the plurality of pad oxide layer patterns 212, a portion of the first filling insulating layer 222, and a portion of the second filling insulating layer 224, which are shown in FIG. 3I, are removed to expose an upper surface 131a, 151a and sidewalls 131b, 151b of an upper portion 131, 151 of each of the plurality of first and second fin-type active regions 130F and 150F.

As a result, a first device isolation layer 222P exposing an upper portion 131, 151 of each of the plurality of first fin-type active region 130F may be formed in the first region I, and a second device isolation layer 224P exposing an upper portion of each of the plurality of second fin-type active region 150F may be formed in the second region II.

In some embodiments, an impurity ion implantation process for adjusting a threshold voltage may be performed on the exposed upper portion 131, 151 of each of the first and second fin-type active regions 130F and 150F in the first region I and the second region II. When the impurity ion implantation process for adjusting a threshold voltage is performed, in the first region I and the second region II, boron (B) ions may be implanted as an impurity into a region for forming an NMOS transistor, and phosphorus (P) or arsenic (As) ions may be implanted as an impurity into a region for forming a PMOS transistor.

Figure 3K:
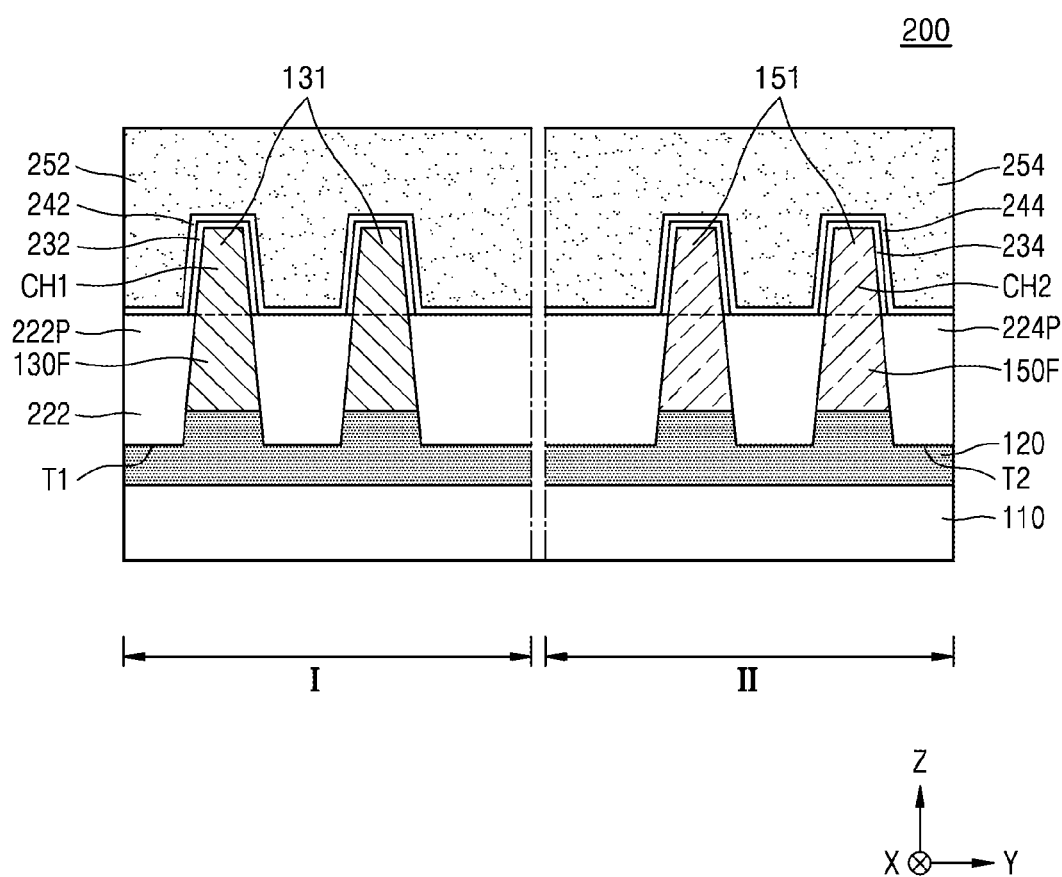

Referring to FIG. 3K, a first interface layer 232, a first gate insulating layer 242, and a first gate 252, which cover a surface of the exposed upper portion 131, 151 of each of the plurality of first fin-type active regions 130F in the first region I, may be sequentially formed in the stated order, and a second interface layer 234, a second gate insulating layer 244, and a second gate 254, which cover a surface of the exposed upper portion of each of the plurality of second fin-type active regions 150F in the second region II, may be sequentially formed in the stated order.

Next, first and second source/drain regions (not shown) may be formed on both sides of each of the first and second gates 252 and 254 in the plurality of first and second fin-type active regions 130F and 150F, thereby fabricating an integrated circuit device 200.

In some embodiments, each of the first interface layer 232 and the second interface layer 234 may include a low-K material layer, for example, a silicon oxide layer, a silicon oxynitride layer, or combinations thereof, the low-K material layer having a dielectric constant of about 9 or less. In some example embodiments, each of the first interface layer 232 and the second interface layer 234 may include silicate, combinations of silicate and a silicon oxide layer, or combinations of silicate and a silicon oxynitride layer. In some embodiments, each of the first interface layer 232 and the second interface layer 234 may have a thickness of about 5 Å to about 20 Å, without being limited thereto. In some embodiments, the first interface layer 232 and the second interface layer 234 may be omitted.

Each of the first gate insulating layer 242 and the second gate insulating layer 244 may include a silicon oxide layer, a high-K dielectric layer, or combinations thereof. The high-K dielectric layer may include a material having a higher dielectric constant than a silicon oxide layer. For example, each of the first gate insulating layer 242 and the second gate insulating layer 244 may have a dielectric constant of about 10 to about 25. The high-K dielectric layer may include a material selected from among hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof, without being limited thereto. Each of the first gate insulating layer 242 and the second gate insulating layer 244 may be formed by an atomic layer deposition (ALD), chemical vapor deposition (CVD), or physical vapor deposition (PVD) process. In some embodiments, the first gate insulating layer 242 may have the same structure as the second gate insulating layer 244. In some example embodiments, the first gate insulating layer 242 may have a different structure than the second gate insulating layer 244.

The upper portions 131, 151 of the plurality of first and second fin-type active regions 130F and 150F may be a first channel region CH1 and a second channel region CH2, respectively. In some embodiments, channels of different conductivity types may be respectively formed in the first channel region CH1 and the second channel region CH2. For example, the first region I may be an NMOS transistor region, and an N-type channel may be formed in the first channel region CH1. The second region II may be a PMOS transistor region, and a P-type channel may be formed in the second channel region CH2.

Each of the first and second gates 252 and 254 may include a metal-containing layer for adjusting a work function and a metal-containing layer for gap-fill, the metal-containing layer for gap-fill filling a space formed over the metal-containing layer for adjusting a work function. In some embodiments, each of the first and second gates 252 and 254 may have a structure in which a metal nitride layer, a metal layer, a conductive capping layer, and a gap-fill metal layer are sequentially stacked in the stated order. Each of the metal nitride layer and the metal layer may include at least one metal selected from among Ti, W, Ru, Nb, Mo, Hf, Ni, Co, Pt, Yb, Tb, Dy, Er, and Pd. Each of the metal nitride layer and the metal layer may be formed by an ALD, metal organic ALD (MOALD), or metal organic CVD (MOCVD) process. The conductive capping layer may serve as a protective layer reducing and/or preventing oxidation of the metal layer. In addition, the conductive capping layer may serve as a wetting layer for facilitating deposition when another conductive layer is deposited on the metal layer. The conductive capping layer may include a metal nitride, for example, TiN, TaN, or combinations thereof, without being limited thereto. The gap-fill metal layer may extend on the conductive capping layer. The gap-fill metal layer may include a W layer. The gap-fill metal layer may be formed by an ALD, CVD, or PVD process. The gap-fill metal layer may fill a recess space, which is formed by a step portion between regions on an upper surface of the conductive capping layer, without voids. In some embodiments, the first and second gates 252 and 254 may include a stacked structure of TiAlC/TiN/W, a stacked structure of TiN/TaN/TiAlC/TiN/W, or a stacked structure of TiN/TaN/TiN/TiAlC/TiN/W. In the stacked structures set forth above, a TiAlC layer or a TiN layer may serve as the metal-containing layer for adjusting a work function.

According to the method of fabricating the integrated circuit device 200, which has been described with reference to FIGS. 3A to 3K, the integrated circuit device, which exhibits a carrier mobility independently improved according to conductivity types of the first and second channel regions CH1 and CH2 formed in the first region I and the second region II, may be easily obtained.

In addition, in the compound composition 172 and 174 included in the slurry composition, the amount of the at least one sulfonate compound 172 and the amount of the at least one terminal-amine-group-including compound 174 are independently controlled, whereby the second semiconductor layer 150 including various materials may be effectively polished, with reducing and/or minimizing a step difference between the second semiconductor layer 150 and the polishing stop layer around the second semiconductor layer 150 and reducing and/or minimizing dishing on the second semiconductor layer 150, and a step difference between the first semiconductor layer 130 in the first region I and the second semiconductor layer 150 in the second region II may be reduced and/or minimized.

Although the method of fabricating the integrated circuit device including a FinFET having a 3-dimensional structured channel has been described with reference to FIGS. 3A to 3K, the inventive concepts are not limited thereto. For example, it will be understood by those skilled in the art that methods of fabricating integrated circuit devices including a planar MOSFET having features according to the inventive concepts may be provided through various changes and modifications of the inventive concepts without departing from the spirit and scope of the inventive concepts as described above.

Figure 4:
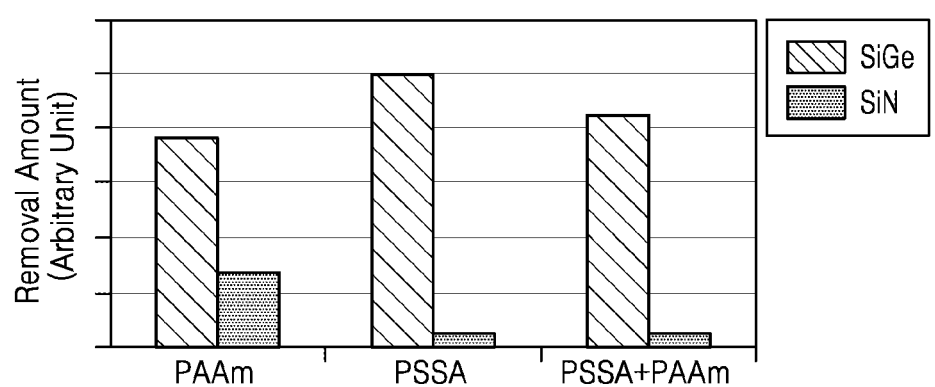
FIG. 4 is a graph depicting evaluation results of improvement of a step difference when a semiconductor layer is polished by using a slurry composition including a compound composition and using a silicon nitride layer as a polishing stop layer, according to a method of fabricating an integrated circuit device according to some example embodiments.

FIG. 4 is a graph depicting evaluation results of improvement of a step difference when a semiconductor layer is polished by using a slurry composition including a compound composition and using a silicon nitride layer as a polishing stop layer, according to a method of fabricating an integrated circuit device in accordance with the inventive concepts.

For the evaluation of FIG. 4, according to the method of fabricating the integrated circuit device in accordance with the inventive concepts, a semiconductor layer including SiGe was polished by using a slurry composition (PSSA+PAAm Example) which included a compound composition including a polystyrene sulfonate (PSSA) and a polyacrylamide (PAAm). Here, a silicon nitride (SiN) layer was used as a polishing stop layer.

The slurry composition included, in addition to the compound composition, silica as polishing particles and ammonium nitrate as an auxiliary oxidant, and the pH of the slurry composition was 4.

In Comparative Example 1, a semiconductor layer including SiGe was polished by using a SiN layer as a polishing stop layer under the same conditions as in PSSA+PAAm Example except that a slurry composition (PAAm Comparative Example) including a compound composition, which included only a PAAm and did not include a sulfonate compound, was used.

In Comparative Example 2, a semiconductor layer including SiGe was polished by using a SiN layer as a polishing stop layer under the same conditions as in PSSA+PAAm Example except that a slurry composition (PSSA Comparative Example) including a compound composition, which included only a PSSA and did not include a terminal amine group-including compound, was used.

From the results of FIG. 4, in the case of PSSA+PAAm Example, it was confirmed that the occurrence of a step difference between the semiconductor (SiGe) layer and the SiN layer could be suppressed since a removal amount due to the polishing of the SiGe layer by the slurry composition and a removal amount due to the polishing of the SiN layer by the slurry composition were maintained at appropriate levels.

Figure 5:
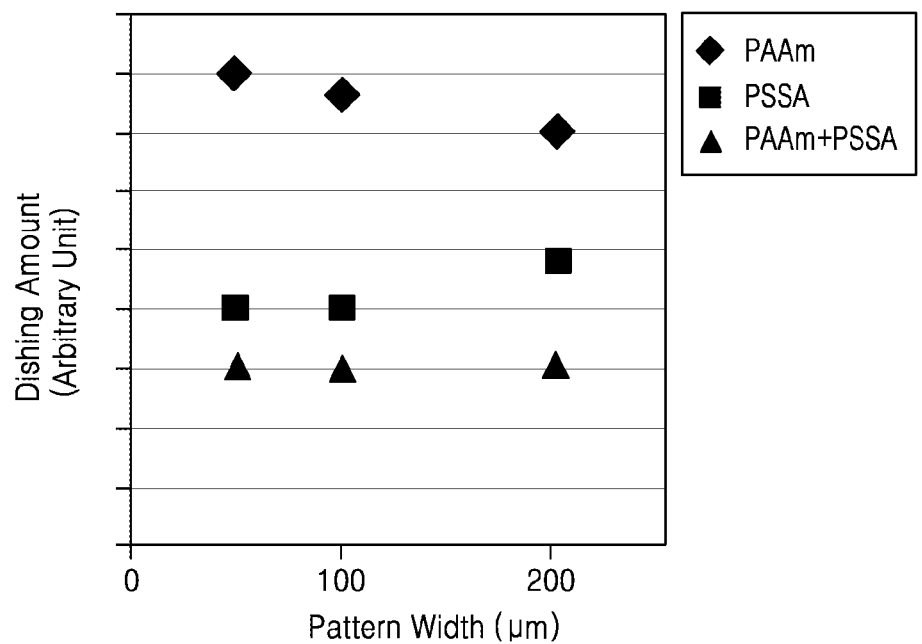
FIG. 5 is a graph depicting measurement results of a dishing amount on a polished surface along with widths of a semiconductor pattern when the semiconductor pattern is polished by using a silicon nitride layer as a polishing stop layer, according to a method of fabricating an integrated circuit device according to some example embodiments.

FIG. 5 is a graph depicting measurement results of a dishing amount on a polished surface along with widths of semiconductor patterns when the semiconductor patterns having various widths were polished by using the slurry composition according to PSSA+PAAm Example, which was used for the evaluation of FIG. 4, the slurry composition according to PAAm Comparative Example, and the slurry composition according to PSSA Comparative Example, and by using a SiN layer as a polishing stop layer.

From the results of FIG. 5, in the case of PSSA+PAAm Example, it was confirmed that the dishing amount of the polishing target layer along with various pattern widths was extremely lower than those in PAAm Comparative Example and PSSA Comparative Example.

Figure 6:
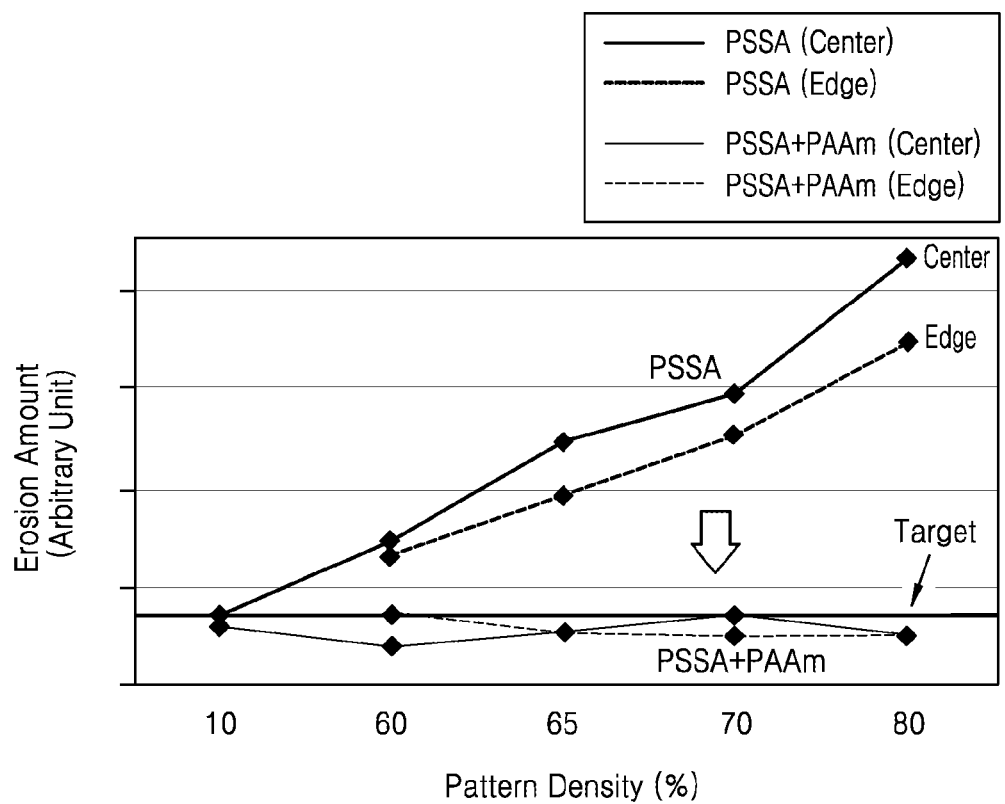
FIG. 6 is a graph depicting measurement results of an erosion amount on a silicon nitride layer when semiconductor patterns having various pattern densities are polished by using a silicon nitride layer as a polishing stop layer, according to a method of fabricating an integrated circuit device according to some example embodiments.

FIG. 6 is a graph depicting measurement results of an erosion amount on a SiN layer when semiconductor patterns having various pattern densities were polished by using the slurry composition according to PSSA+PAAm Example, which was used for the evaluation of FIG. 4, and the slurry composition according to PSSA Comparative Example, and by using the SiN layer as a polishing stop layer.

In the graph of FIG. 6, the term "Center" in the legend denotes a measurement value in a central portion of a substrate including a polishing target layer, and the term "Edge" in the legend denotes a measurement value in an edge portion of the substrate including the polishing target layer.

From the results of FIG. 6, in the case of PSSA+PAAm Example, it could be confirmed that the erosion amount of the polishing target layer along with various pattern densities was significantly improved, as compared with that in PSSA Comparative Example. In particular, even at a pattern density of about 80%, which corresponds to a pattern density relatively vulnerable to erosion, it could be seen that there occurred almost no erosion in the case of PSSA+PAAm Example.

Figure 7:
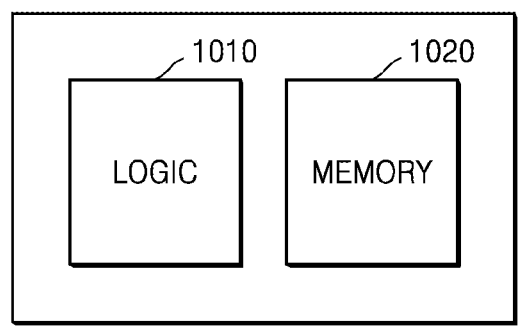
FIG. 7 is a block diagram of an electronic device according to some example embodiments.

FIG. 7 is a block diagram of an electronic device according to some example embodiments.

Referring to FIG. 7, an electronic device 1000 includes a logic area 1010 and a memory area 1020.

The logic area 1010 may include a processor. The processor may include various logic cells including a plurality of circuit elements, such as transistors, registers, and the like, as standard cells performing desired logic functions, such as counters, buffers, and the like. The logic cells may include, for example, AND, NAND, OR, NOR, exclusive OR (XOR), exclusive NOR (XNOR), inverter (INV), adder (ADD), buffer (BUF), delay (DLY), filter (FILL), multiplexer (MXT/MXIT), OR/AND/INVERTER (OAI), AND/OR (AO), AND/OR/INVERTER (AOI), D flip-flop, reset flip-flop, master-slave flip-flop, latch logic cells, and the like. However, the logic cells set forth above are merely examples, and the inventive concepts are not limited thereto.

The memory area 1020 may include a memory. The memory may include at least one of an SRAM, a DRAM, an MRAM, an RRAM, and a PRAM.

The logic area 1010 and the memory area 1020 may include at least one integrated circuit device, which may be obtained by the method described with reference to FIGS. 1 to 3K, and integrated circuit devices, which are modified and changed therefrom without departing from the spirit and scope of the inventive concepts and have various structures.

Figure 8:
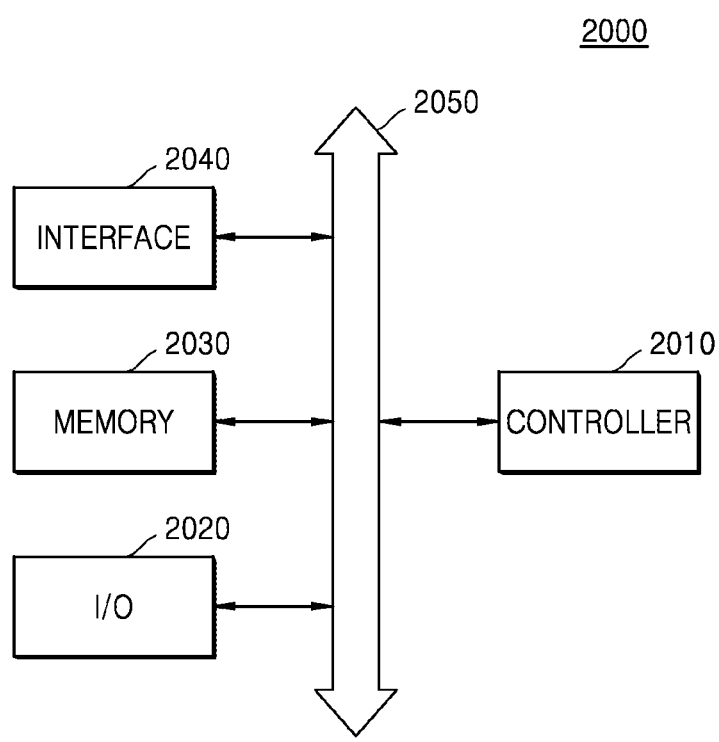
FIG. 8 is a block diagram of an electronic system according to some example embodiments.

FIG. 8 is a block diagram of an electronic system according to some example embodiments.

Referring to FIG. 8, an electronic system 2000 includes a controller 2010, an input/output (I/O) device 2020, a memory 2030, and an interface 2040, and these components are connected to each other through a bus 2050.

The controller 2010 may include one or more processors. The controller 2010 may include at least one of microprocessors, digital signal processors, and processing devices similar thereto. The input/output device 2020 may include at least one of keypads, keyboards, and displays. The memory 2030 may be used to store commands executed by the controller 2010. For example, the memory 2030 may be used to store user data.

The electronic system 2000 may constitute a wireless communication device, or a device capable of transmitting and/or receiving information in a wireless environment. In the electronic system 2000, to transmit/receive data through a wireless communication network, the interface 2040 may include a wireless interface. The interface 2040 may include an antenna and/or a wireless transceiver. In some embodiments, the electronic system 2000 may be used for a communication interface protocol of a third generation communication system, such as code division multiple access (CDMA), global system for mobile communications (GSM), North American digital cellular (NADC), extended-time division multiple access (E-TDMA), and/or wide band code division multiple access (WCDMA) systems. The electronic system 2000 may include at least one of integrated circuit devices, which are obtained by the method described with reference to FIGS. 1 to 3K, and integrated circuit devices, which are modified and changed therefrom without departing from the spirit and scope of the inventive concepts and have various structures.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method of fabricating an integrated circuit device, the method comprising:
   forming a polishing stop layer and a semiconductor layer on a substrate; and
   selectively polishing the semiconductor layer from an upper surface, the upper surface simultaneously exposing an upper surface of the polishing stop layer and an upper surface of the semiconductor layer, based on applying a slurry composition to the upper surface, the slurry composition including a compound composition and polishing particles, the compound composition including a sulfonate compound and a terminal amine group-including compound,
   wherein the semiconductor layer includes at least one layer of a Ge-containing layer and a Group III-V compound layer.

2. The method according to claim 1, wherein each of the sulfonate compound and the terminal amine group-including compound includes a polymer having a molecular weight of 1,000 to 1,000,000.

3. The method according to claim 1, wherein the sulfonate compound includes a polystyrene sulfonate.

4. The method according to claim 1, wherein the sulfonate compound includes at least one selected from among C10 to C13 alkylbenzene sulfonates, dodecylbenzene sulfonates, α-olefin sulfonates, ligno sulfonates, trimethylsilyl trifluoromethanesulfonate, guaiazulene sulfonates, diisopropyl naphtalene sulfonates, petroleum sulfonates, and toluene sulfonates.

5. The method according to claim 1, wherein the terminal amine group-including compound includes an amine polymer or an amide polymer.

6. The method according to claim 1, wherein the terminal amine group-including compound includes at least one selected from among polyacrylamides, polydimethylacrylamides, poly-N-isopropylamides, polyvinylacetamides, polyoxyethyleneamides, polyarylamines, poly(N-methylvinylamines), poly(N-methyldiarylamines), polyoxypropylenediamines, polyvinylamines, and polyetheramines.

7. The method according to claim 1, wherein the polishing particles include
   a metal oxide, an organic or inorganic material-coated metal oxide, or
   a colloidal metal oxide.

8. The method according to claim 1, wherein,
   the polishing stop layer is a silicon nitride layer, and
   the semiconductor layer is a SiGe layer.

9. The method according to claim 1, wherein,
   the slurry composition further includes at least one selected from among an oxidant, a free radical supplying agent, an auxiliary oxidant, and a pH regulator, and
   the compound composition is present in an amount of 0.01 wt % to 10 wt % in the slurry composition.

10. The method according to claim 9, wherein,
    the free radical supplying agent includes an organic acid, and
    the auxiliary oxidant includes a nitrate.

11. A method of fabricating an integrated circuit device, the method comprising:
    forming a first semiconductor layer on a first region and a second region of a substrate, such that a first portion of the first semiconductor layer is on the first region and a second portion of the first semiconductor layer is on the second region;
    forming a mask pattern on the first portion of the first semiconductor layer, the mask pattern covering the first portion of the first semiconductor layer such that the second portion of the first semiconductor layer is exposed by the mask pattern;
    forming a recess space on the second region based on at least partially removing the second portion of the first semiconductor layer exposed by the mask pattern;
    filling the recess space with a second semiconductor layer to form a combined layer, the combined layer including at least the mask pattern and the second semiconductor layer, the combined layer including an upper surface, the upper surface of the combined layer including an upper surface of the mask pattern and an exposed upper surface of the second semiconductor layer;
    polishing the second semiconductor layer based on applying a slurry composition to the upper surface of the combined layer such that the mask pattern is a polishing stop layer, the slurry composition including a compound composition and polishing particles, the compound composition including a sulfonate compound and a terminal amine group-including compound;
    removing the mask pattern; and
    forming a plurality of fin-type active regions on each of the first region and the second region by patterning each of the first semiconductor layer and the second semiconductor layer.

12. The method according to claim 11, wherein,
the first semiconductor layer and the second semiconductor layer include different materials selected from among Group IV materials and Group III-V materials, and
the mask pattern is a silicon nitride layer.

13. The method according to claim 11, wherein the slurry composition further includes at least one selected from among an oxidant, a free radical supplying agent, an auxiliary oxidant, and a pH regulator.

14. The method according to claim 11, wherein the slurry composition has a pH of about 3 to about 5.

15. The method according to claim 11, wherein the compound composition includes a polystyrene sulfonate and a polyacrylamide.

16. A method, comprising:
forming a polishing stop layer and a semiconductor layer on a substrate to form a combined layer, the combined layer including an upper surface, the upper surface of the combined layer including an upper surface of the semiconductor layer and an upper surface of the polishing stop layer; and
selectively polishing the semiconductor layer, based on applying a slurry composition to the upper surface of the combined layer, the slurry composition including a compound composition and polishing particles, the compound composition including a sulfonate compound and a terminal amine group-including compound,
wherein the semiconductor layer includes at least one layer of a Ge-containing layer and a Group III-V compound layer.

17. The method of claim 16, wherein,
the semiconductor layer includes a protruding portion that protrudes from the polishing stop layer such that the upper surface of the semiconductor layer is elevated above the upper surface of the polishing stop layer; and
selectively polishing the semiconductor layer includes substantially removing the protruding portion of the semiconductor layer based on applying the slurry composition to the upper surface of the combined layer.

18. The method of claim 16, wherein
selectively polishing the semiconductor layer includes applying the slurry composition to the upper surface of the combined layer such that the upper surface of the semiconductor layer is oxidized by the slurry composition to form a surface oxide layer on the semiconductor layer.

19. The method of claim 16, wherein:
forming the polishing stop layer and the semiconductor layer on the substrate to form the combined layer includes
  forming a first semiconductor layer on the substrate,
  forming the polishing stop layer on a first portion of the first semiconductor layer, such that a second portion of the first semiconductor layer is exposed by the polishing stop layer,
  removing the second portion of the first semiconductor layer to form a recess in the first semiconductor layer, and
  forming a second semiconductor layer in the recess, such that the semiconductor layer is the second semiconductor layer.

20. The method of claim 19, further comprising:
removing the slurry composition and the polishing stop layer to expose, an upper surface of the first semiconductor layer and an upper surface of the second semiconductor layer; and
removing a portion of the second semiconductor layer such that the upper surfaces of the first and second semiconductor layers are substantially coplanar.

* * * * *